US006449465B1

(12) United States Patent
Gailus et al.

(10) Patent No.: US 6,449,465 B1
(45) Date of Patent: Sep. 10, 2002

(54) METHOD AND APPARATUS FOR LINEAR AMPLIFICATION OF A RADIO FREQUENCY SIGNAL

(75) Inventors: Paul H. Gailus, Prospect Heights; William J. Turney, Schaumburg, both of IL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/468,025

(22) Filed: Dec. 20, 1999

(51) Int. Cl.[7] .............................. H01Q 11/12; H04B 1/04
(52) U.S. Cl. .................... 455/126; 455/127; 330/10; 330/136
(58) Field of Search ................ 330/10, 127, 135, 330/136; 455/126, 127, 108, 112, 260, 295

(56) References Cited

U.S. PATENT DOCUMENTS

| | | | | |
|---|---|---|---|---|
| 5,719,527 A | * | 2/1998 | Bateman et al. | 330/10 |
| 5,894,496 A | * | 4/1999 | Jones | 455/126 |
| 5,978,662 A | | 11/1999 | Swales | 455/126 |
| 6,125,266 A | | 9/2000 | Matero et al. | 455/126 |
| 6,141,390 A | * | 10/2000 | Cova | 375/297 |
| 6,246,286 B1 | * | 6/2001 | Persson | 330/149 |
| 6,396,344 B1 | * | 5/2002 | Gentzler et al. | 330/149 |

* cited by examiner

*Primary Examiner*—Edward F. Urban
*Assistant Examiner*—Temica M. Davis
(74) *Attorney, Agent, or Firm*—Steven A. May

(57) ABSTRACT

A method and apparatus is provided that amplitude modulates a modulated radio frequency (RF) signal (411) by modulating the supply voltage of a power amplifier (410). The method and apparatus further provides an impedance modulator (412) that reduces output signal (415) errors in response to an error signal generated by a feedback circuit (416) that includes a quadrature modulator (506), a limiter (520), a comparator (502), and a quadrature downconverter (510). Intermodulation distortion generated in the feedback circuit (416) by delay mismatches between amplitude and phase feedback paths, and non-linear effects of AM/PM conversion in a limiter (520), are suppressed by placing limiter (520) and quadrature downconverter (510) in a forward path of the overall amplifier loop.

44 Claims, 9 Drawing Sheets

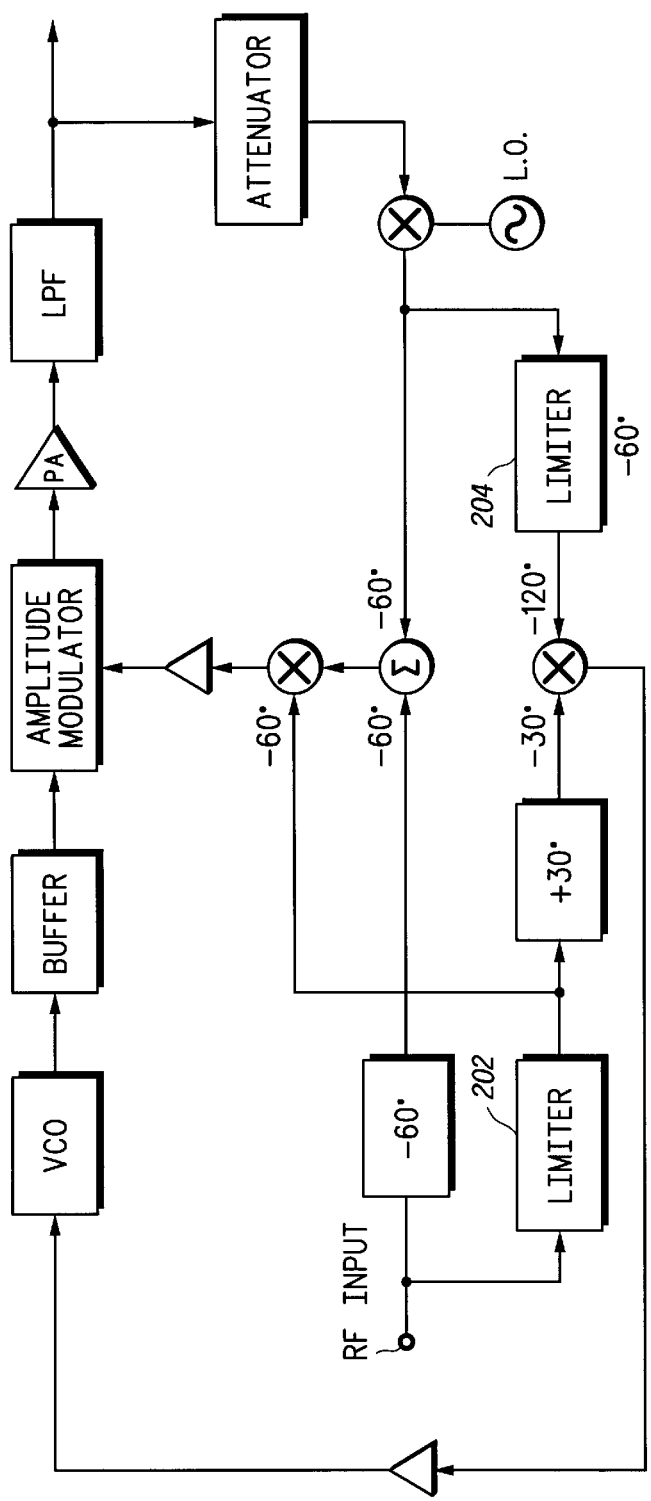
FIG. 2 —PRIOR ART—
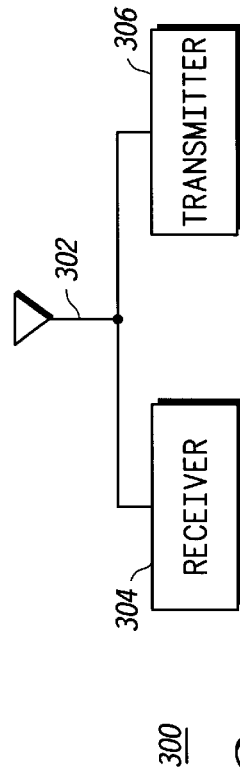
FIG. 3

METHOD AND APPARATUS FOR LINEAR AMPLIFICATION OF A RADIO FREQUENCY SIGNAL

FIELD OF THE INVENTION

This invention is generally related to amplifiers and, in particular, to linear amplifiers.

BACKGROUND OF THE INVENTION

Amplifiers are known to be either linear or nonlinear. Linearity is a measure of how closely the output signal of an amplifier resembles the input signal of the amplifier. Linear amplification is important when information is contained in the amplitude of a signal, such as amplitude modulated (AM) signals. Known digital wireless communication systems use a digital modulation scheme that impresses information on a radio frequency (RF) carrier signal by modulating both the amplitude and the phase of the RF carrier, such as a 16-ary quadrature amplitude modulation (16-ary QAM) digital modulation scheme. Since the amplitude of the RF carrier is being modulated, amplification is typically linear. In linear amplification, an RF amplifier, typically an RF power transistor, is typically biased for class A or class AB operation.

A drawback to class A and class AB bias operation is low efficiency. Efficiency is a measure of the level of conversion of input RF power and input DC power to output RF power. Class A bias amplifiers typically have efficiencies of well under 50% while class C (non-linear) bias amplifiers can approach 85% efficiency. The result of lower efficiency operation is greater power consumption to produce a desired level of output power, more limited RF output power for a given DC power source, and more complex thermal issues since an implication of lower efficiency is the dissipation of a greater percentage of the power consumed in the form of heat. These issues are critical when amplifier operation is constrained by battery life or when heat dissipation is constrained by transmitter size and an absence of fans.

To overcome the tradeoff of linearity for low efficiency, ideas have been developed in which linear operation is achieved while at the same time amplifiers are operated with a non-linear class C bias. One such linear amplifier is an envelope elimination and restoration (EER) amplifier, in which an RF signal is amplified by a class C biased amplifier and the RF signal's amplitude is modulated by modulating the DC supply voltage of the amplifier. Problems faced by an open loop EER system is that they typically cannot achieve the stringent adjacent channel coupled power (ACCP) specifications of digital products such as the "iDEN" product line of Motorola, Inc., of Schaumburg, Illinois or the TETRA (Terrestrial Trunked Radio) standards. Also, the bandwidth of the amplitude modulation provided by the modulation of the DC supply voltage is limited by the maximum switching rate of the DC power supply, which maximum switching rate with acceptable efficiency is generally about 1 Megahertz (MHz), with the result that the amplitude of the output signal is an incomplete replica of the amplitude of the input signal. And furthermore, variation of the supply voltage of the amplifier produces undesirable phase variation in the amplified signal.

To overcome the deficiencies of an open loop EER system, feedback loops have been added. Cartesian feedback loops require the use of quadrature amplitude modulators as a signal source for the RF amplifiers. However, quadrature modulators generate excessive wideband noise that must be filtered out by external filters. In the alternative, polar feedback loops have been proposed.

One polar feedback EER transmitter is described in a paper entitled "Envelope-elimination-and-restoration system concepts," by Frederick Raab, Proceedings of RF Expo East, Nov. 11–13, 1987, Boston, Mass., pp. 167–177. FIG. 1 is a block diagram illustration of Raab's polar feedback EER transmitter 100, based on FIG. 5, p. 177, of Raab. Polar feedback transmitter 100 includes a top feedback path that provides amplitude (envelope) correction and a bottom feedback path that provides phase correction. The top feedback path includes two envelope detectors 104, 106, and the bottom feedback path includes two limiters 108, 110. Envelope detector 104 and limiter 108 are both coupled to an RF input node 102, and respectively generate amplitude and phase modulation signals at baseband frequencies based on the modulated RF input signal. There are a number of disadvantages to Raab's transmitter 100. First, delays through the amplitude and phase paths must be very closely matched or off-channel intermodulation distortion (IMD) will result. Second, IMD is generated by non-linearities of the envelope detectors 104, 106. Even with the provision of matched envelope detectors, some mismatch in detection characteristics and the resultant IMD is inevitable. And third, the phase errors due to AM/PM conversion in the limiters 108, 110 is not corrected by the loop and will also result in IMD in the transmitter 100 output.

Another polar feedback loop transmitter is presented by Watkinson, U.S. Pat. No. 4,618,999. A block diagram illustration of Watkinson's polar loop transmitter 200 is shown in FIG. 2. Watkinson eliminates the need for the matched envelope detectors required by Raab. However, as in Raab, Watkinson's polar feedback loop resolves the loop error signal into phase and amplitude error signals by separate phase and amplitude feedback paths, which feedback paths compare the desired signal input with a sample of the output. As with Raab, this means that the IMD is sensitive to the matching of delays in the two feedback paths. Furthermore, the phase loop of Watkinson is nearly identical to the phase loop of Raab and, like Raab, requires the matching of two limiters (i.e., limiter 202 and limiter 204). As with Raab, the phase errors due to AM/PM conversion in the limiters 202, 204 is not corrected by the loop.

Therefore, a need exists for a method and apparatus for linear amplification of an RF signal, which method and apparatus provide the high efficiency possible with an EER amplifier, provide the ACCP and intermodulation distortion performance required for most digital communication systems, and are more tolerant of design and component variations than the prior art.

BRIEF DESCRIPTION OF THE DRAWINGS

FIG. 2 is a block diagram of a linear transmitter of the prior art.

FIG. 3 is a block diagram of a communication device in accordance with a preferred embodiment of the present invention.

DESCRIPTION OF A PREFERRED EMBODIMENT

Figure 1:
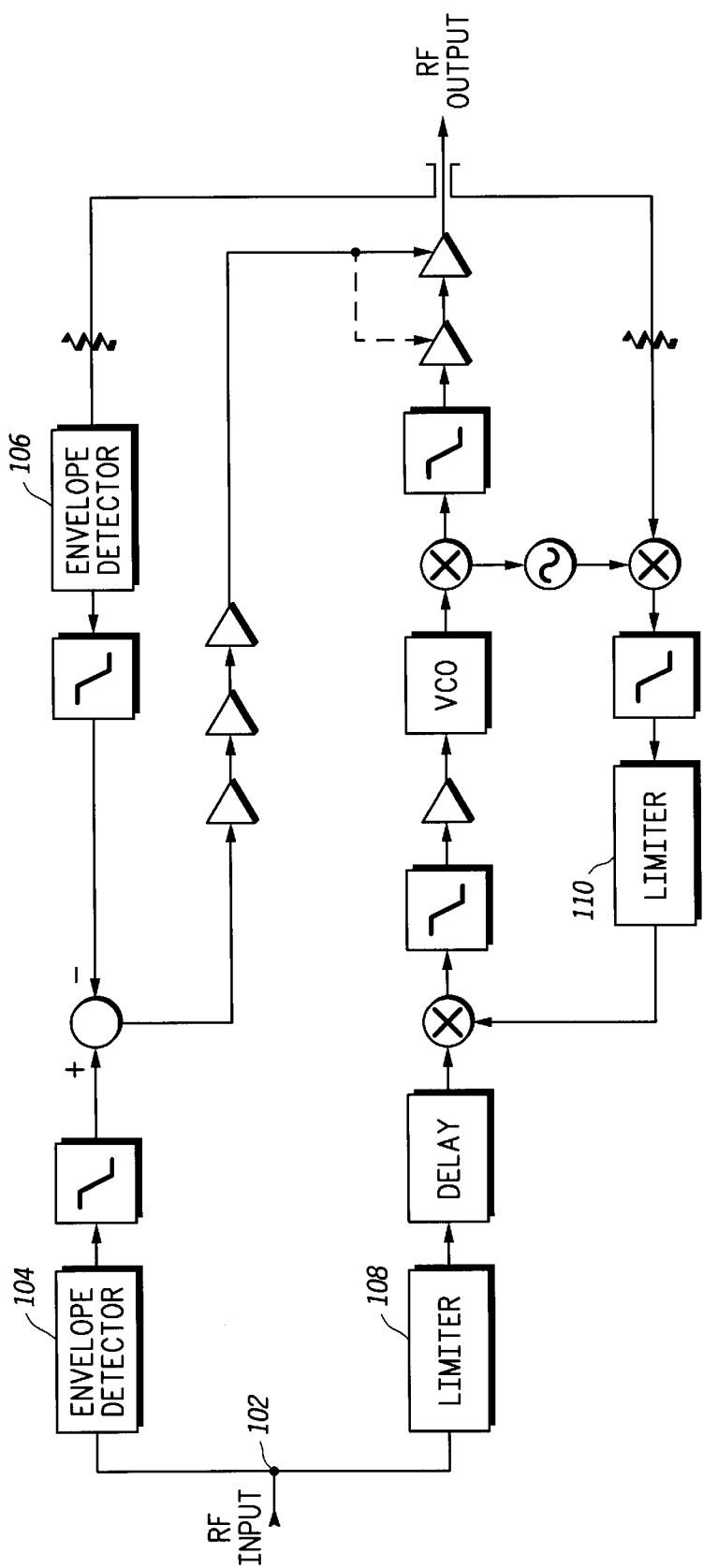
FIG. 1 is a block diagram of a linear transmitter of the prior art.

To address the need for a method and apparatus for linear amplification of a radio frequency (RF) signal, which method and apparatus provide the high efficiency possible with an envelope elimination and restoration (EER) amplifier, provide the adjacent channel coupled power and intermodulation distortion performance required for digital communication systems, and are more tolerant of design and component variations than the prior art, a method and apparatus is provided that amplitude modulates a modulated radio frequency (RF) signal by modulating the supply voltage of a power amplifier. The method and apparatus further provides an impedance modulator that reduces output signal errors in response to an error signal generated by a feedback circuit that includes a quadrature modulator, a limiter, a comparator, and a quadrature downconverter. Intermodulation distortion generated in the feedback circuit by delay mismatches between amplitude and phase feedback paths, and nonlinear effects of AM/PM conversion in a limiter, are suppressed by placing the limiter and the quadrature downconverter in a forward path of the overall amplifier loop.

Generally, the present invention encompasses an apparatus for the linear amplification of an RF signal. The apparatus includes a modulating amplifier that is effective to modulate, in response to at least one control signal, and to amplify an RF input signal to produce an output signal. The modulating amplifier includes at least one input port coupled to receive the RF input signal, an amplifier that amplifies the RF input signal, an impedance modulator that modulates the RF input signal in response to the at least one control signal, and an output port. The apparatus further includes a signal coupler, coupled to the modulating amplifier, that is effective to sample a portion of the output signal to produce an attenuated output signal, and a feedback circuit, coupled to the signal coupler and the modulating amplifier, that is effective to determine a modulation error between a baseband input signal and the attenuated output signal and is effective to generate the at least one control signal to reduce the modulation error.

Another embodiment of the present invention encompasses an apparatus for the linear amplification of a radio frequency signal. The apparatus includes an amplifier having at least one input port coupled to receive a modulated input signal and an output port that is effective to produce an output signal based on the modulated input signal, a first modulator, coupled to the at least one input port of the amplifier, that is effective to generate a modulated input signal responsive to at least one control signal, and a signal coupler, coupled to the output port of the amplifier, that is effective to sample a portion of the output signal to produce an attenuated output signal. The apparatus further includes a polar feedback circuit, coupled to the signal coupler and at least the first modulator, that is effective to receive a baseband input signal, to determine a modulation error between the baseband input signal and the attenuated output signal, and to generate the at least one control signal to reduce the modulation error. The polar feedback circuit includes a second modulator that is effective to produce a phase modulated reference signal corresponding to a phase variation of the baseband input signal, a phase-shifting circuit, coupled to the second modulator, that is effective to introduce an approximately ninety degree phase offset to the phase modulated reference signal to produce a phase-shifted reference signal, and a first mixer, coupled to the phase-shifting circuit, the signal coupler, and the first modulator, that is effective to produce at least one control signal representing a phase modulation error based on a difference between the attenuated output signal and the phase-shifted reference signal.

A further embodiment of the present invention encompasses a method for amplifying a radio frequency (RF) signal. The method includes the steps of receiving a composite baseband signal, wherein the composite baseband signal comprises an amplitude component, amplifying the RF signal, amplitude modulating the RF signal based on an amplitude component of the composite baseband signal, and modulating the amplified and amplitude modulated RF signal to produce an output signal. The method further includes the steps of sampling a portion of the output signal to produce an attenuated output signal, determining a desired attenuated output signal based on the composite baseband signal, determining a modulation error based on a difference between the attenuated output signal and the desired attenuated output signal, producing at least one control signal based on the modulation error, and adjusting the amplified and amplitude modulated phase modulated radio frequency signal based on the at least one control signal to produce a corrected output signal.

Finally, a further embodiment of the present invention encompasses a method for amplifying a radio frequency (RF) signal. The method comprises the steps receiving a composite baseband signal, wherein the composite baseband signal comprises a phase component and an amplitude component, phase modulating the RF signal based on the phase component of the composite baseband signal to produce a phase modulated RF signal, amplifying the phase modulated RF signal, modulating the amplitude of the phase modulated RF signal based on the amplitude component of the composite baseband signal, and modulating the amplified and amplitude modulated phase modulated RF signal to produce an output signal. The method further comprises the steps of sampling a portion of the output signal to produce an attenuated output signal, downconverting the attenuated output signal to produce a downconverted attenuated output signal, comparing the composite baseband signal and the downconverted attenuated output signal, and determining a modulation error based on a difference between the downconverted attenuated output signal and the composite baseband signal. The method further comprises the steps of producing at least one control signal based on the modulation error and adjusting the amplified and amplitude modulated phase modulated RF signal based on the at least one control signal to produce a corrected output signal.

The present invention can be better understood with reference to FIGS. 3–10. FIG. 3 illustrates a communication device 300 in accordance with a preferred embodiment of the present invention. The communication device 300 preferably comprises an "iDEN" radiotelephone commercially available from Motorola, Inc. of Schaumburg, Illinois, with additional functionality so that the communication device is capable of performing all functions described below. Communication device 300 preferably includes an antenna 302 coupled to a receiver 304 and to a linear transmitter 306.

Figure 4:
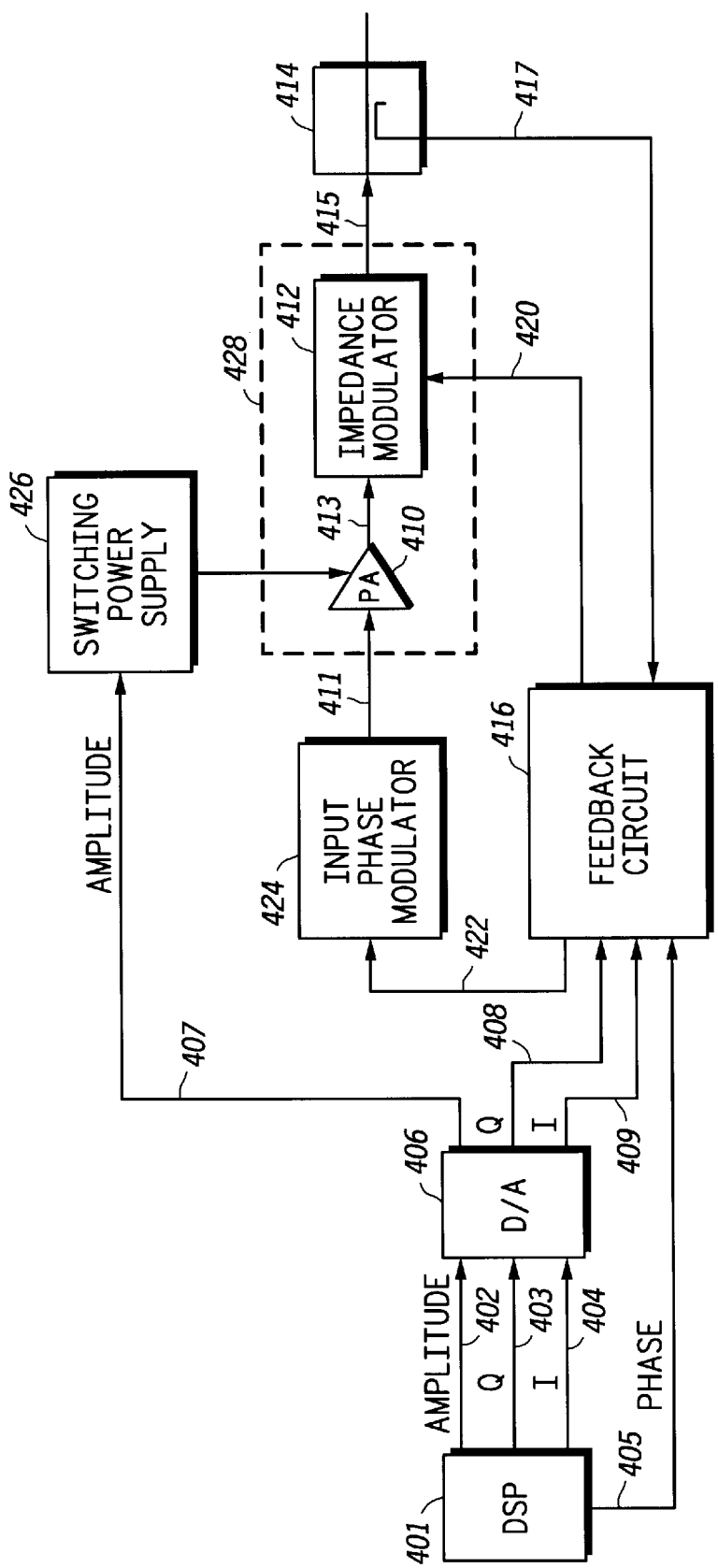
FIG. 4 is a block diagram of a linear transmitter in accordance with the preferred embodiment of the present invention.

FIG. 4 illustrates a linear transmitter 306 in accordance with a preferred embodiment of the present invention. Linear transmitter 306 preferably includes a digital signal processor (DSP) 401, which DSP 401 is coupled to or includes associated memory, a digital-to-analog converter (D/A) set 406 coupled to DSP 401 and including at least one D/A, and a switching power supply 426 coupled to D/A set 406. Linear transmitter 306 further includes a modulating amplifier 428 having multiple input ports for receiving modulated input signals and an output port that produces output signals, which output signals each include amplified and modulated versions of the modulated input signals. One port of the multiple input ports, preferably a supply port, preferably is coupled to switching power supply 426 and another port of the multiple input ports preferably is coupled to an input phase modulator 424. Modulating amplifier 428 preferably includes a power amplifier 410 that amplifies a modulated input signal and an impedance modulator 412, coupled to power amplifier 410, that modulates a modulated input signal. Power amplifier 410 preferably precedes impedance modulator 412, although in an alternate embodiment their order may be reversed.

In the preferred embodiment, linear transmitter 306 further includes a signal coupler 414, preferably a directional coupler, coupled to an output of modulating amplifier 428, and a feedback circuit 416 coupled to DSP 401, to D/A set 406, to input phase modulator 424, to modulating amplifier 428, and to signal coupler 414. Preferably, power amplifier 410 includes a radio frequency (RF) amplifying element such as a power transistor, input and output matching networks, and biasing and decoupling circuitry as are necessary to allow the functionality of the RF amplifying element and to bias the RF amplifying element class C; however, in the alternative, those of ordinary skill in the art will realize that other high efficiency non-linear biases, such as class B, might be used here without departing from the spirit and scope of the present invention. Input phase modulator 424 preferably is a voltage controlled oscillator (VCO) synthesizer that sources a phase modulated RF carrier signal 411 to power amplifier 410; however, those of ordinary skill in the art will realize that input phase modulator 424 might alternatively be any kind of frequency reference with dividers and a feedback loop that allows a phase modulated RF carrier signal 411 sourced by input phase modulator 424 to be shifted for phase adjustments.

The operation of the linear transmitter 306 is as follows in accordance with the preferred embodiment. DSP 401 functions as an information source. DSP 401 generates a digital baseband input signal, preferably a quadrature modulation information signal, which baseband input signal includes an in-phase (I) component 404 and a quadrature (Q) component 403. The baseband input signal is sourced to D/A set 406 and to feedback circuit 416. D/A set 406 receives in-phase component 404 and produces an analog version 409 of in-phase component 404, and D/A set 406 receives quadrature component 403 produces an analog version 408 of quadrature component 403. DSP 401 also converts the quadrature modulation information signal to a polar format and generates an amplitude component 402 and a phase component 405 of the input signal. Conversion of the representation of a signal from a Cartesian representation (wherein the signal is represented by in-phase and quadrature components) to a polar representation (wherein the signal is represented by amplitude and phase components), or from a polar representation to a Cartesian representation, is accomplished by DSP 401 by the execution of well known conversion algorithms, which algorithms are stored in the memory coupled to or associated with DSP 401. Amplitude component 402 is sourced to D/A set 406, and D/A set 406 produces an analog version 407 of amplitude component 402. Analog amplitude component 407 is then conveyed by D/A set 406 to switching power supply 426.

Switching power supply 426 generates a supply voltage and a supply current that is sourced to, and serve as the direct current (DC) feed for, the RF amplifier element in power amplifier 410. Switching power supplies are well known in the art and are known to comprise a control circuit and a switching element that are used to regulate an output supply voltage. A control circuit of switching power supply 426 modulates the amplitude of the supply voltage by adjusting the duty cycle of a switching element based on variations in analog amplitude component 407.

In the preferred embodiment, an RF input signal 411 is generated by input phase modulator 424 and is input into power amplifier 410. The RF amplifying element of power amplifier 410 then produces an amplified and modulated RF signal 413 by amplifying RF input signal 411 and by modulating the amplitude of RF input signal 411 based on the amplitude modulation of the supply voltage. However, the amplitude modulation provided by the modulation of the supply voltage of power amplifier 410 is bandwidth limited by the maximum switching rate of the switching element in power supply 426. The result is that the amplitude modulation of amplified and modulated RF signal 413 is an incomplete replica of analog amplitude component 407 and will not comply with the linearity requirements of many digital standards.

Power amplifier 410 conveys amplified and modulated RF signal 413 to impedance modulator 412. Impedance modulator 412 preferably is a scalar modulator that modulates only the amplitude of amplified and modulated RF signal 413; however, in the alternative, impedance modulator 412 may be a complex modulator that modulates both the amplitude and the phase of amplified and modulated RF signal 413, or may be any type of modulator that presents an adjustable impedance to a signal. Impedance modulator 412 preferably includes a series transmission line and a shunt variable capacitance element, preferably a varactor, in parallel with a shunt inductive element; however, those of ordinary skill in the art will know of a variety of combinations of elements that can be used to create an impedance modulator and that any variable capacitance element can be used, such as a variable voltage capacitor (VVC), without departing from the spirit and scope of the present invention.

Impedance modulator 412 modulates the amplitude of amplified and modulated RF signal 413 based on an error signal 420 generated by feedback circuit 416 to produce an output signal 415. Impedance modulator 412 conveys output signal 415 to signal coupler 414. Signal coupler 414 produces an attenuated output signal 417, which attenuated output signal 417 is conveyed to feedback circuit 416.

Figure 5:
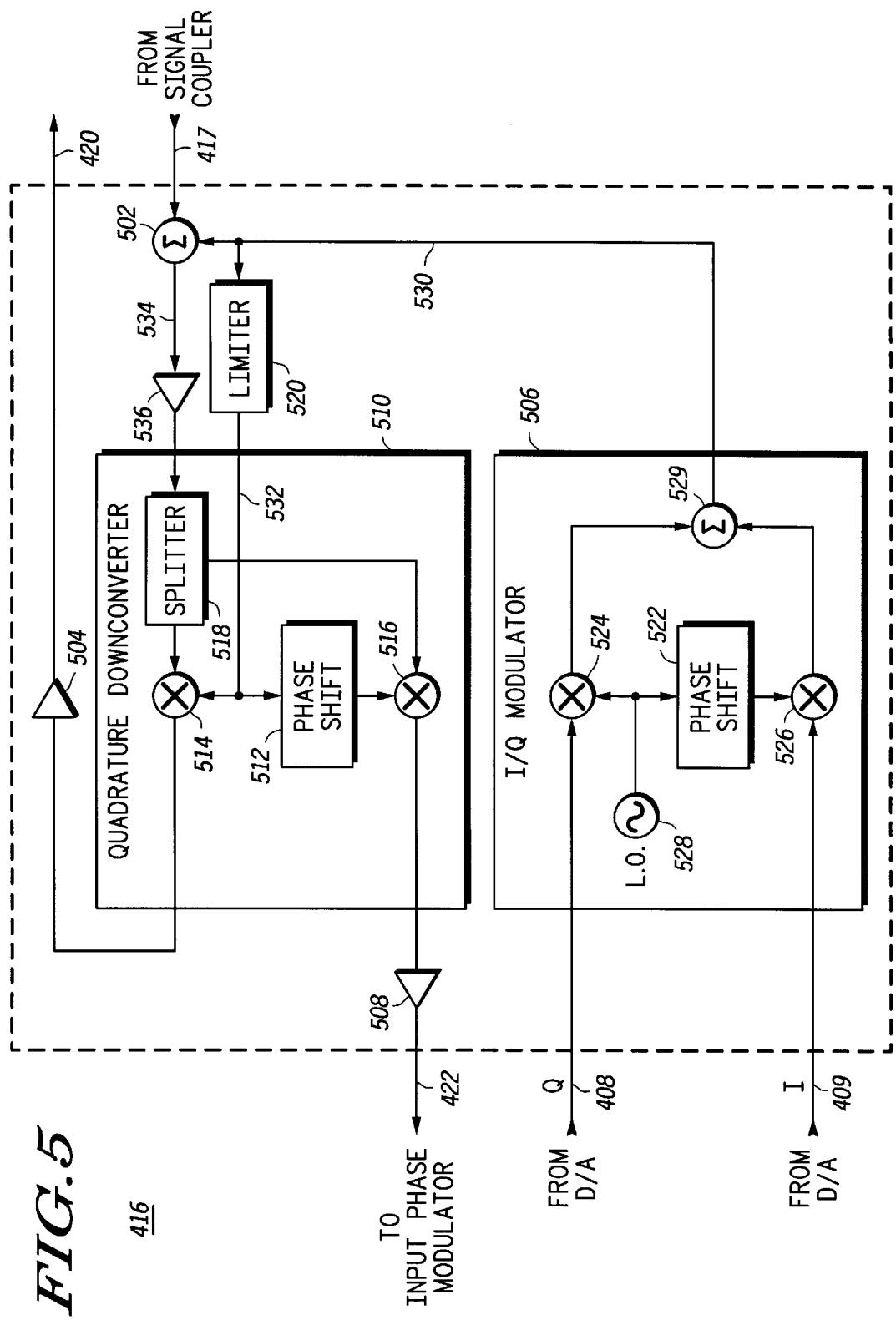
FIG. 5 is a block diagram of a feedback circuit portion of a linear transmitter in accordance with the preferred embodiment of the present invention.

The operation of feedback circuit 416 in accordance with the preferred embodiment is described in detail in subsequent paragraphs with respect to FIG. 5. To summarize, feedback circuit 416 includes a polar feedback circuit; that is, feedback circuit 416 samples a signal and produces an amplitude component and a phase component of the sampled signal. Feedback circuit 416 receives, from D/A set 406, analog quadrature component 408 and analog in-phase component 409 of the quadrature modulation information signal. Feedback circuit 416 upconverts, preferably to the frequency of output signal 415, and combines the two components 408, 409 to produce a quadrature modulated information signal at the frequency of output signal 415. Feedback circuit 416 determines a difference between the upconverted quadrature modulated information signal and attenuated output signal 417 to produce an error signal. Feedback circuit 416 then resolves the error signal into separate polar (i.e., amplitude and phase) error signals and downconverts each error signal to a baseband frequency to produce first and second polar baseband error signals 420, 422.

In the preferred embodiment, first polar baseband error signal 420, preferably a baseband amplitude error signal, is conveyed to impedance modulator 412. Impedance modulator 412 reduces a modulation error, preferably an amplitude modulation error, by modulating amplified and modulated RF signal 413 based on first polar error signal 420. Second polar baseband error signal 422, preferably a baseband phase error signal, is conveyed to input phase modulator 424. Input phase modulator 424 reduces a modulation error, preferably an phase modulation error, by modulating RF input signal 411 based on second polar error signal 422.

In an alternate embodiment of the feedback circuit 416, described below with respect to FIG. 7, a feedback circuit 700 sums the quadrature modulated information signal and the attenuated output signal at an intermediate frequency instead of at the output signal frequency. Feedback circuit 700 upconverts each of the quadrature and in-phase components 408, 409 to an intermediate frequency (IF), combines the two upconverted components, downconverts attenuated output signal 417 to the IF, and then compares the combined components to the downconverted attenuated output signal at the IF to produce an error signal at IF, which error signal is then resolved into polar components and downconverted to baseband.

In another alternate embodiment of the feedback circuit 416, described below with respect to FIG. 6, a feedback circuit 600 compares an amplitude component of the input signal (i.e., analog version 407 of amplitude component 402) to an amplitude component of attenuated output signal 417 (i.e., an amplitude component resolved by mixer 614) at a baseband frequency to produce an amplitude error signal.

In sum, linear transmitter 306 amplitude modulates RF input signal 411 by modulating a supply voltage of power amplifier 410. Although this allows for a higher efficiency design, that is, allowing for a class C bias of the amplifying element as opposed to class A or class AB, this also results in an incomplete replica of the desired signal (i.e., the information signal generated by DSP 401) due to the limited bandwidth of the supply voltage modulation. To reduce the resulting errors, linear transmitter 306 further includes a polar feedback circuit that generates multiple polar error signals 420, 422. In response to error signals 420, 422, linear transmitter 306 reduces amplitude and phase errors in an output signal 415. In the preferred embodiment, the amplitude error of the output signal 415 is reduced by impedance modulator 412 and the phase error of the output signal 415 is reduced by an input phase modulator 424. By utilizing impedance modulator 412, errors due to bandwidth limitations of a switching power supply 426, which switching power supply 426 produces the supply voltage, may be overcome.

FIG. 5 is a block diagram of feedback circuit 416 in accordance with a preferred embodiment of the present invention. Feedback circuit 416 includes a comparator 502, preferably a subtractor, coupled to an amplifier 536, a quadrature modulator 506 coupled to the comparator 502 and to an amplitude suppressor 520, and a quadrature downconverter 510 coupled to the amplifier 536, the amplitude suppressor 520, a first feedback amplifier 504, and a second feedback amplifier 508.

The operation of feedback circuit 416 is as follows in accordance with the preferred embodiment. Quadrature component 408 and in-phase component 409 of the quadrature modulation information signal are each conveyed by D/A set 406 to quadrature modulator 506. Quadrature modulator 506 upconverts, to approximately a frequency of output signal 415, quadrature component 408 and in-phase component 409 and combines the two upconverted components to produce an upconverted quadrature modulated information signal 530 as follows.

In the preferred embodiment, quadrature modulator 506 includes a first phase-shifting circuit 522 coupled to a first modulator mixer 524 and to a second modulator mixer 526, a local oscillator circuit 528 coupled to first phase-shifting circuit 522 and to first modulator mixer 524, and a combiner 529 coupled to first modulator mixer 524 and second modulator mixer 526. First modulator mixer 524 receives quadrature component 408 and second modulator mixer 526 receives in-phase component 409. First modulator mixer 524 and second modulator mixer 526 each also receive a reference signal generated by local oscillator 528 at approximately a frequency of output signal 415. Second modulator mixer 526 receives the reference signal via first phase-shifting circuit 522, which phase-shifting circuit 522 introduces an approximately 90⁰ phase offset to the reference signal. The first and second modulator mixers 524, 526 each multiply their respectively received quadrature and in-phase components 408, 409 with their respectively received reference signals to produce upconverted versions of quadrature component 408 and in-phase component 409. The upconverted quadrature and in-phase components are then combined in combiner 529, preferably a quadrature combiner, to produce an upconverted quadrature modulated information signal 530 at approximately the frequency of output signal 415.

Upconverted quadrature modulated information signal 530 is conveyed to comparator 502. Also conveyed to comparator 502 is attenuated output signal 417 from signal coupler 414. Comparator 502 compares upconverted quadrature modulated information signal 530 and attenuated output signal 417, and produces an error signal 534 based on a difference between signals 530 and 417, wherein the frequency of error signal 534 is approximately the same as the frequency of output signal 415. Error signal 534 is conveyed amplifier 536, where error signal 534 is amplified and then conveyed to quadrature downconverter 510.

Upconverted quadrature modulated information signal 530 also is conveyed to amplitude suppressor 520. Amplitude suppressor 520, preferably a limiter, suppresses the amplitude modulation of upconverted quadrature modulated information signal 530 to produce a phase modulated reference signal 532 at approximately the frequency of output signal 415. Phase modulated reference signal 532 is then also conveyed to quadrature downconverter 510.

In the preferred embodiment, quadrature downconverter 510 includes a first downconverter mixer 514 and a second downconverter mixer 516. Quadrature downconverter 510 further includes a second phase-shifting circuit 512 and a signal splitter 518, each of which are coupled to each of the two mixers 514, 516. Preferably, each of first phase-shifting circuit 522 and second phase-shifting circuit 512 provides a phase delay of approximately 90° at a frequency of interest and includes a quarter-wavelength transmission line at the frequency of interest; however, those of ordinary skill in the art will realize that there are many other ways to design phase-shifting circuits without departing from the spirit and scope of the present invention and that phase-shifting circuits are often designed into integrated circuits (IC's), such as a quadrature modulator IC, using active circuitry.

In quadrature downconverter 510, signal splitter 518 splits amplified error signal 534 into a first portion, which is conveyed to first downconverter mixer 514, and a second portion, which is conveyed to second downconverter mixer 516. First downconverter mixer 514 also receives phase modulated reference signal 532, and multiplies phase modulated reference signal 532 with the first portion of amplified error signal 534 to produce a first polar error signal, preferably representing an amplitude modulation error. The first polar error signal is conveyed to a first feedback amplifier 504. First feedback amplifier 504 amplifies the first polar error signal to produce a first control signal 420, and conveys first control signal 420 to impedance modulator 412. Impedance modulator 412 reduces the amplitude modulation error of amplified and modulated RF signal 413 output by power amplifier 410 by modulating the amplitude of amplified and modulated RF signal 413 in response to first control signal 420.

Second downconverter mixer 516 receives phase modulated reference signal 532 via first phase-shifting circuit 512, which phase-shifting circuit introduces an approximately 90° phase offset to phase modulated reference signal 532. Second mixer 516 multiplies the phase offset phase modulated reference signal with the second portion of amplified error signal 534 to produce a second polar error signal, preferably representing a phase modulation error. The second polar error signal is conveyed to second feedback amplifier 508, where the second polar error signal is amplified to produce a second control signal 422. Second control signal 422 is then conveyed to input phase modulator 424. Input phase modulator 424 reduces the phase modulation error of the output signal 415 by phase modulating RF carrier signal 411 to produce a phase modulated carrier signal in response to second control signal 422.

In alternate embodiments of the present invention, quadrature downconverter 510 can comprise a single mixer. For example, quadrature downconverter 510 can comprise first downconverter mixer 514 and produce the first control signal as described above, or alternatively can comprise phase-shifting circuit 512 coupled to second downconverter mixer 516 and produce the second control signal as described above. The respective product of each mixer 514, 516, i.e., the first polar error signal and second polar error signal, is then processed as described above.

In another alternate embodiment of the present invention, linear transmitter 306 does not include impedance modulator 412. The output of power amplifier 410 is coupled to signal coupler 414, and feedback circuit 416 is coupled to switching power supply 426 instead of to impedance modulator 412. Signal coupler 414 receives amplified and modulated RF signal 413 from power amplifier 410. Signal coupler 414 samples a portion of amplified and modulated RF signal 413 to produce attenuated output signal 417, which attenuated output signal 417 is conveyed to feedback circuit 416. As described above in the preferred embodiment, feedback circuit 416 produces first control signal 420 and second control signal 422. Also as described above in the preferred embodiment, second control signal 422 is amplified and conveyed to input phase modulator 406. However, unlike in the preferred embodiment, first control signal 420 is conveyed to switching power supply 426 instead of impedance modulator 412, and switching power supply 426 reduces the amplitude modulation error by adjusting the amplitude modulation of RF carrier signal 411 in response to first control signal 420.

In general, feedback circuit 416 determines a single transmitter error 534 at comparator 502 based on a comparison of a derivative of the input signal (i.e., upconverted quadrature modulated information signal 530) and a derivative of output signal 415 (i.e., attenuated output signal 417). Error signal 534 is amplified and conveyed to quadrature downconverter 510, which resolves error signal 534 into separate polar baseband error signals, using phase modulated reference signal 532, produced by limiter 520, as a local oscillator signal. The separate polar baseband error signals, which include an amplitude error signal (produced by downconverter mixer 514) and a phase error signal (produced by downconverter mixer 516), are each amplified and respectively conveyed to impedance modulator 412 and input phase modulator 424 for reduction of transmitter 306 error.

Since a single error signal 534, rather than separate error signals, is determined, the need in the prior art for carefully matched phase and amplitude feedback paths is minimized. Furthermore, limiter 520 and quadrature downconverter 510 are in the forward path of the overall transmitter 306 loop. As a result, any non-linearities resulting from AM/PM conversion in the limiter 520, or intermodulation distortion (IMD) resulting from delay mismatches in amplitude and phase paths through quadrature downconverter 510, occur in forward paths of the overall transmitter 306 loop and are suppressed by transmitter 306 feedback loops (i.e., the loops including the path from signal coupler 414, to comparator 502, and to quadrature downconverter 510, and then the paths from quadrature downconverter 510 to impedance modulator 412 via first feedback amplifier 504 and from quadrature downconverter 510 to input phase modulator 424 via second feedback amplifier 508).

In addition, by resolving the transmitter 306 error as a single error signal 534 at comparator 502, subsequent amplification of error signal 534 by amplifier 536 can be provided without degrading transmitter linearity because error signal 534 is relatively small in magnitude. And by amplifying the inputs to downconverter mixers 514, 516, as opposed to the outputs of downconverter mixers 514, 516, any detrimental impact of any DC offsets that result from the realization of the mixers 514, 516 is reduced because amplification is provided prior to the occurance of the DC offsets.

Figure 6:
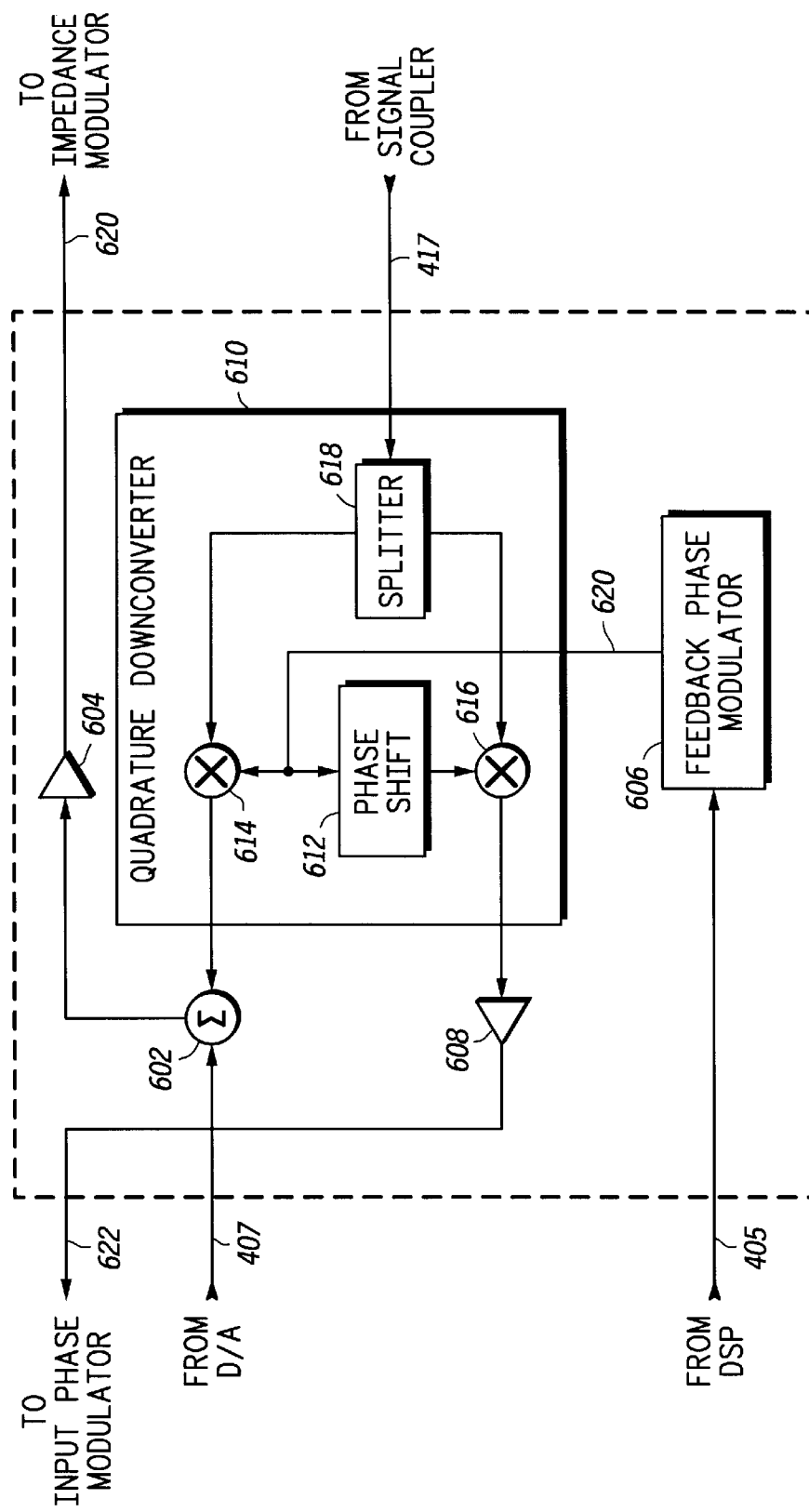
FIG. 6 is a block diagram of a feedback circuit portion of a linear transmitter in accordance with an alternate embodiment of the present invention.

FIG. 6 is a block diagram of a feedback circuit 600 in accordance with an alternate embodiment of the present invention. In the alternate embodiment, analog amplitude component 407 of the input signal sourced by DSP 101 is conveyed by D/A set 406 to feedback circuit 600 in addition to being conveyed to switching power supply 426.

Feedback circuit 600 includes a feedback phase modulator 606, preferably a frequency synthesizer, a quadrature downconverter 610 coupled to the feedback phase modulator 606, and a comparator 602 coupled to the quadrature downconverter 610. Preferably, feedback circuit 600 further includes multiple feedback amplifiers, preferably a first feedback amplifier 604 coupled to comparator 602 and a second feedback amplifier 608 coupled to quadrature downconverter 610. Preferably, quadrature downconverter 610 includes a first mixer 614 and a second mixer 616, wherein each mixer 614, 616 is coupled to a phase-shifting circuit 612, preferably a quarter-wavelength transmission line at a frequency of interest, and to a signal splitter 618.

The operation of feedback circuit 600 is as follows. Attenuated output signal 417 is conveyed to signal splitter 618, preferably a hybrid signal splitter, where attenuated output signal 417 is divided into multiple portions. A first portion of attenuated output signal 417 is conveyed to first mixer 614 and a second portion of attenuated output signal 417 is conveyed to second mixer 616. Also conveyed to each of first mixer 614 and second mixer 616 is a phase-modulated reference signal 620 generated by feedback phase modulator 606 based on a digital representation of a phase component 405 of the input signal, which component 405 is generated by and received from DSP 401. However, second mixer 616 receives phase-modulated reference signal 620 via phase-shifting circuit 612, which phase shifting circuit introduces a phase offset of approximately 90° to phase modulated reference signal 620.

First mixer 614 multiplies the first portion of attenuated output signal 417 with phase modulated reference signal 620 to produce a downconverted first baseband signal. Second mixer 616 multiplies the second portion of attenuated output signal 417 with the phase offset version of phase modulated reference signal 620 to produce a downconverted second baseband signal.

The downconverted first baseband signal is conveyed to comparator 602, preferably a subtractor. Comparator 602 compares the downconverted first baseband signal to analog amplitude component 407 of the input signal and produces a first error signal, preferably representing an amplitude modulation error, based on a difference between the two compared signals. The amplitude modulation error signal is amplified by first feedback amplifier 604 to produce a first control signal 620. First control signal 620 is conveyed to impedance modulator 412, and impedance modulator 412 modulates the amplitude of the amplified and modulated RF signal 413 in response to first control signal 620, preferably by adjusting the capacitance of the varactor based on the voltage of the amplitude modulation error signal. The downconverted second baseband signal comprises a second error signal, preferably representing a phase modulation error. The phase modulation error signal is amplified by second feedback amplifier 608 to produce a second control signal 622 and is then conveyed to input phase modulator 424. In response to second control signal 622, input phase modulator 424 reduces the phase modulation error by adjusting a phase of RF carrier signal 411 that is sourced to power amplifier 410.

In general, in the alternate embodiment as described in FIG. 6, a comparator (i.e., comparator 602) is positioned after a quadrature downconverter (i.e., quadrature downconverter 610), whereas in the preferred embodiment described in FIG. 5, a comparator (i.e., comparator 502) precedes a quadrature downconverter (i.e., quadrature downconverter 510). As a result, in the preferred embodiment, a fed back version of the output signal is compared to a fed forward version of the desired input signal at the frequency of output signal 415, whereas in the alternate embodiment a fed back version of the output signal is compared to a fed forward version of the desired input signal (i.e., analog amplitude component 407) at baseband. In the alternate embodiment, the error signal is determined at baseband, subsequent to the downconversion of attenuated output signal 417, as opposed to the preferred embodiment where the error signal is determined at RF.

In another alternate embodiment of the present invention, quadrature downconverter 610 includes a single mixer. In one alternate embodiment, quadrature downconverter 610 includes first mixer 614 and produces the first downconverted baseband signal as described above. In another alternate embodiment, quadrature downconverter 610 includes second mixer 616 coupled to phase-shifting circuit 612 and produces the second downconverted baseband signal as described above. The respective product of each mixer 614, 616 is then processed as is described above in the preferred embodiment.

In still another alternate embodiment of the present invention, the first control signal includes a high frequency component and a low frequency component, and feedback circuit 600 further includes a low pass filter coupled to first feedback amplifier 604 and to switching power supply 426, and a high pass filter coupled to first feedback amplifier 604 and to impedance modulator 412. The low pass filter receives at least a portion of the first control signal from first feedback amplifier 604, filters out the high frequency component to produce a low frequency control signal, and conveys the low frequency control signal to switching power supply 426. The high pass filter receives at least a portion of the first control signal from first feedback amplifier 604, filters out the low frequency component to produce a high frequency control signal, and conveys the high frequency control signal to impedance modulator 412. Switching power supply 426 reduces the amplitude modulation error by adjusting the amplitude modulation of RF carrier signal 411 in response to the low frequency control signal, and impedance modulator 412 reduces the amplitude modulation error by modulating the amplitude of amplified and modulated RF signal 413 in response to the high frequency control signal.

Figure 7:
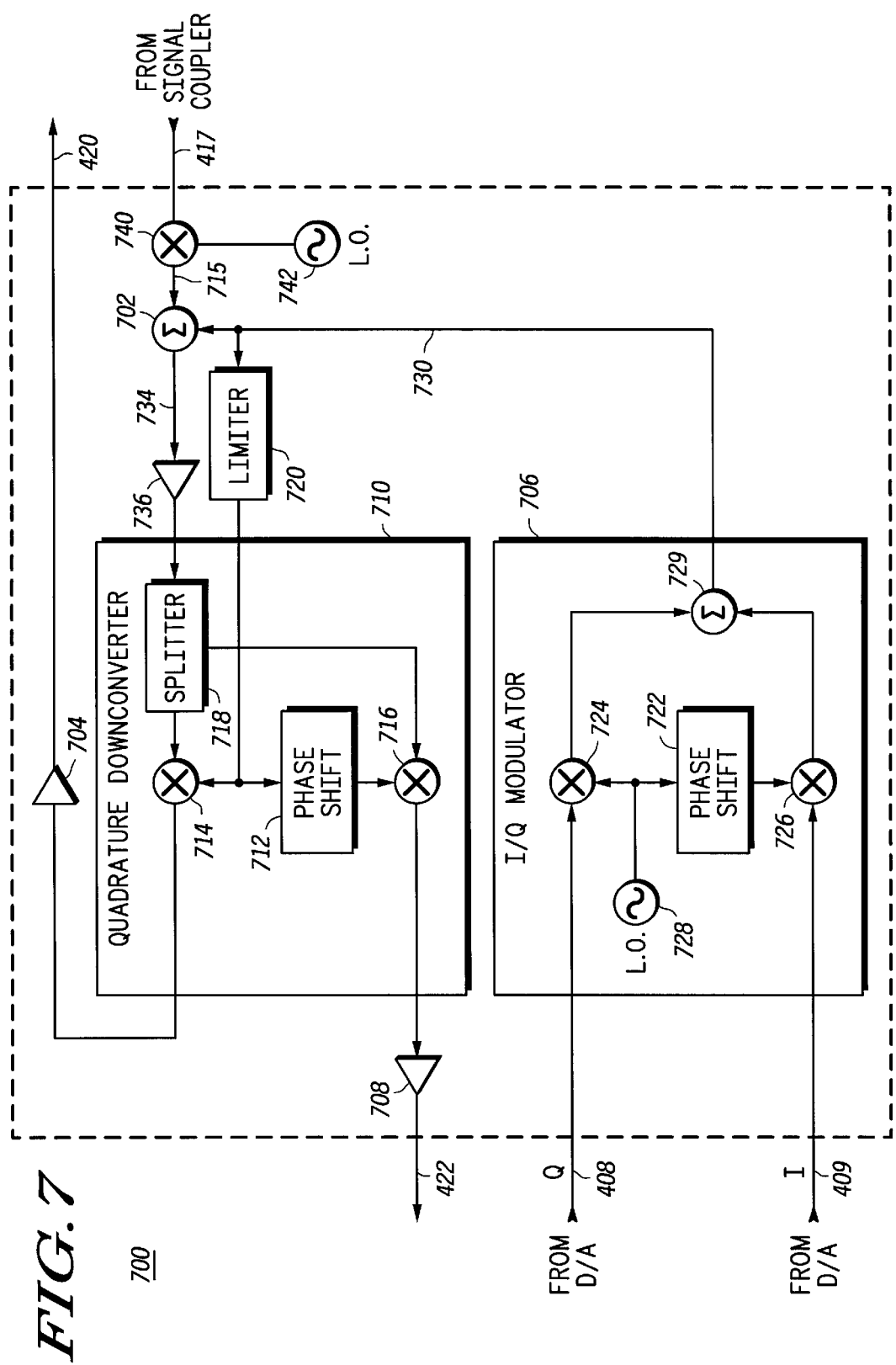
FIG. 7 is a block diagram of a feedback circuit portion of a linear transmitter in accordance with a further alternate embodiment of the present invention.

FIG. 7 is a block diagram of a feedback circuit 700 in accordance with yet another alternate embodiment of the present invention. Similar to feedback circuit 416 described above in regard to FIG. 5, feedback circuit 700 includes a comparator 702, preferably a subtractor, coupled to an amplifier 736, a quadrature modulator 706 coupled to comparator 702 and to an amplitude suppressor 720, preferably a limiter, and a quadrature downconverter 710 coupled to amplifier 736, to amplitude suppressor 720, to a first feedback amplifier 704, and to a second feedback amplifier 708. Quadrature modulator 706 includes a first phase-shifting circuit 722 and a combiner 729, each of which are coupled to a first modulator mixer 724 and to a second modulator mixer 726. Quadrature modulator 706 further includes a first local oscillator circuit 728 coupled to first phase-shifting circuit 722 and to first modulator mixer 724. Quadrature downconverter 710 includes a second phase-shifting circuit 712 and a signal splitter 718, each of which are coupled to a first downconverter mixer 714 and to a second downconverter mixer 716. First and second phase-shifting circuits 722, 712 each preferably provide a phase shift of approximately 90° at the frequency of interest and preferably comprise a quarter-wavelength transmission line at a frequency of interest.

With respect to FIGS. 5 and 7, like numerals designate like components (e.g., comparator 502 and comparator 702, first downconverter mixer 514 and first downconverter mixer 714) that perform like functions, except that in feedback circuit 700 first local oscillator 728 generates a reference signal at approximately an intermediate frequency of interest (IF) and feedback circuit 700 further comprises a feedback mixer 740, coupled to signal coupler 414 and to comparator 702, and a second local oscillator circuit 742, coupled to feedback mixer 740.

The operation of feedback circuit 700 is as follows. First modulator mixer 724 receives quadrature component 408 and second modulator mixer 726 receives in-phase component 409 from D/A set 406. First modulator mixer 724 and second modulator mixer 726 each also receive an IF reference signal generated by first local oscillator 728. However, second modulator mixer 726 receives the reference signal via first phase-shifting circuit 722, which phase-shifting circuit 722 introduces an approximately 90° phase offset to the reference signal. The first and second modulator mixers 724, 726 each multiply their respectively received quadrature and in-phase components 408, 409 with their respectively received IF reference signals to produce upconverted versions of quadrature component 408 and in-phase component 409. The upconverted quadrature and in-phase components are then combined in combiner 729, preferably a quadrature combiner, to produce an upconverted quadrature modulated information signal 730 at the IF that is conveyed to comparator 702.

Second local oscillator circuit 742 generates a signal of a frequency that, when-multiplied with a signal of the frequency of output signal 415, produces a signal at approximately an intermediate frequency (IF) of interest. Feedback mixer 740 receives attenuated output signal 417 from signal coupler 414 and downconverts attenuated output signal 417 to the IF to produce an IF attenuated output signal 715. IF attenuated output signal 715 is then conveyed to comparator 702.

Comparator 702 compares upconverted quadrature modulated information signal 730 to IF attenuated output signal 715 and produces an error signal 734, at a frequency approximately equal to the IF, based on a difference between signals 730 and 715. Error signal 734 is conveyed to amplifier 736, where error signal 734 is amplified and then conveyed to quadrature downconverter 710.

Upconverted quadrature modulated information signal 730 also is conveyed to amplitude suppressor 720. Amplitude suppressor 720 suppresses the amplitude modulation of upconverted quadrature modulated information signal 730 to produce a phase modulated reference signal 732 at approximately the IF, which phase modulated reference signal 732 is conveyed to quadrature downconverter 710. Quadrature downconverter 710 receives phase modulated reference signal 732 and amplified error signal 734 and, similar to the preferred embodiment as described above in regard to FIG. 5 except that the downconversion is from the IF to baseband instead of from the output signal frequency 415 to baseband, produces first control signal 420 and second control signal 422. First control signal 420 and second control signal 422 are then used to modulate the amplitude modulation error and the phase modulation error of output signal 415 in the manner described above with respect to FIG. 5.

In general, in the alternate embodiment described in FIG. 7, comparator 702 is placed before quadrature downconverter 710 and a feedback mixer (i.e., feedback mixer 740) has been added to downconvert attenuated output signal 417 to an intermediate frequency. The operation of feedback circuit 700 at an intermediate frequency allows for the cost and operational advantages inherent in intermediate frequency signal processing.

Figure 8:
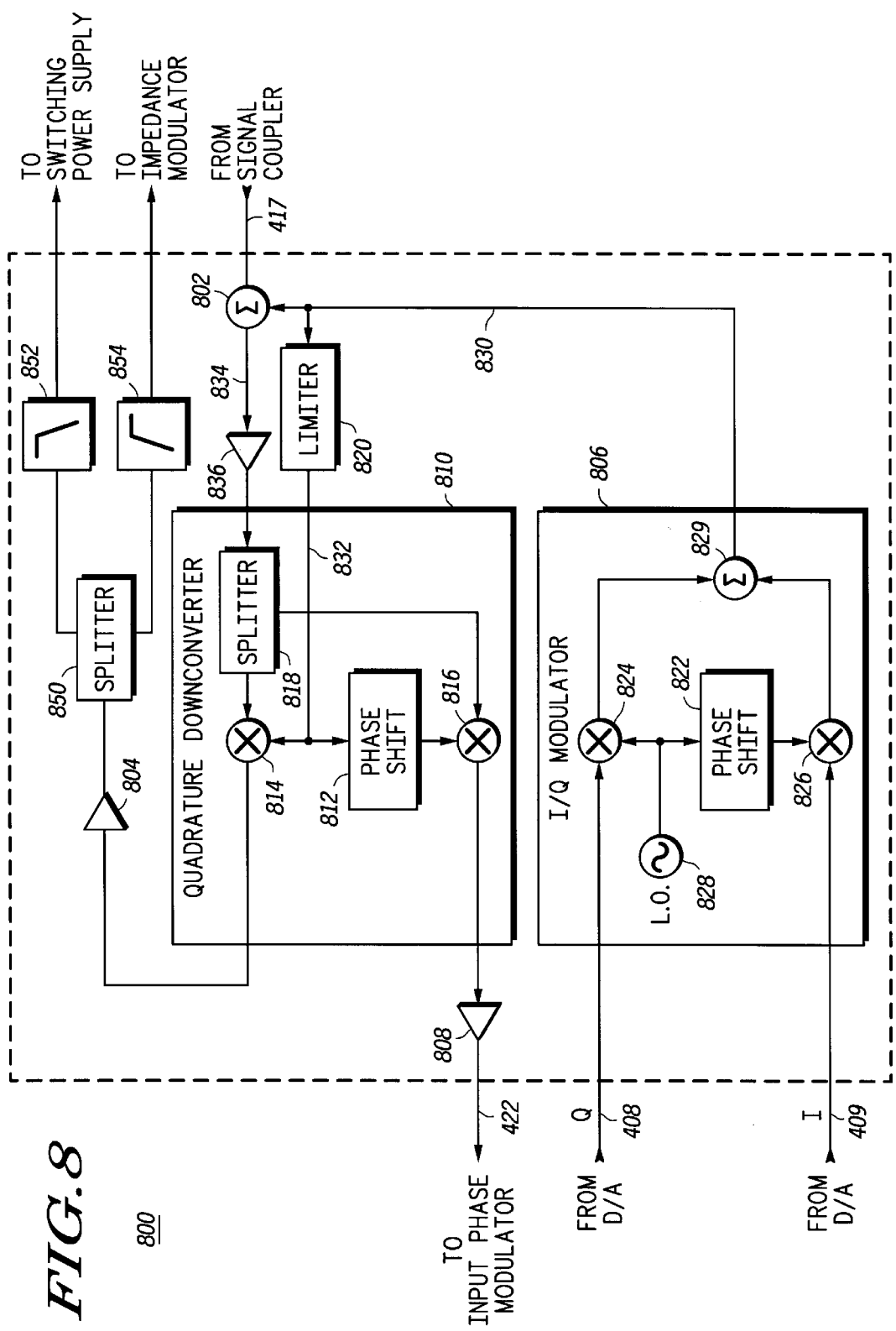
FIG. 8 is a block diagram of a feedback circuit portion of a linear transmitter in accordance with a further alternate embodiment of the present invention.

FIG. 8 is a block diagram of the feedback circuit 800 in accordance with yet a further alternate embodiment of the present invention. Feedback circuit 800 is identical to feedback circuit 416 described in FIG. 5, wherein like numbers designate like components, except that feedback circuit 800 further includes a signal splitter 850 coupled to first feedback amplifier 804, a low pass filter 852 coupled to signal splitter 850 and switching power supply 426, and a high pass filter 854 coupled to signal splitter 850 and to impedance modulator 412. Furthermore, the amplified first control signal produced by first feedback amplifier 804 includes a low frequency component and a high frequency component.

The operation of feedback circuit 800 is identical to the operation of feedback circuit 416 as described in FIG. 5, except that signal splitter 850 splits the amplified first control signal produced by first feedback amplifier 804 into multiple portions. A first portion of the multiple portions is conveyed to low pass filter 852. A second portion of the multiple portions is conveyed to high pass filter 854. Low pass filter 852 filters out the high frequency component of the amplified first control signal to produce a low frequency control signal and conveys the low frequency control signal to switching power supply 426. High pass filter 854 filters out the low frequency component of the amplified first control signal to produce a high frequency control signal and conveys the high frequency control signal to impedance modulator 412. Switching power supply 426 adjusts the amplitude modulation of RF carrier signal 411 to reduce the amplitude modulation error in response to the low frequency control signal, and impedance modulator 412 reduces the amplitude modulation error of amplified and modulated RF signal 413 output by the power amplifier 410 by modulating the amplitude of the amplified and modulated RF signal 413 in response to the high frequency control signal.

In general, the present invention, as described above, provides a high efficiency linear transmitter with the ACCP and amplitude modulation performance required for most digital communication systems. By amplitude modulating RF carrier signal 411 via the supply voltage of power amplifier 410, the RF amplifying element in power amplifier 410 can be biased high efficiency class C. The additional amplitude modulation provided by impedance modulator 412 overcomes the bandwidth limitations of amplitude modulation via switching power supply 426.

The use of a polar feedback circuit as opposed to Cartesian feedback permits the generation of RF carrier signal 411 by a VCO synthesizer as opposed to a quadrature generator, with the advantage of the low wideband noise of VCO synthesizers. Also, the use of a VCO synthesizer eliminates the problems of imperfect gain for each of the I and Q components and the resulting imperfect quadrature inherent in the use of a quadrature generator. Furthermore, by determining a single error signal that is subsequently resolved into separately polar error signals, and by including portions of feedback circuit 416 in the forward path of an overall loop of linear transmitter 306, the effect of delay mismatches in the separate feedback paths of the prior art is minimized. In addition, by amplifying the error signal before, rather than after, downconverter mixers 514, 516, any detrimental impact of any DC offsets used to realize the mixers is reduced.

Figure 9:
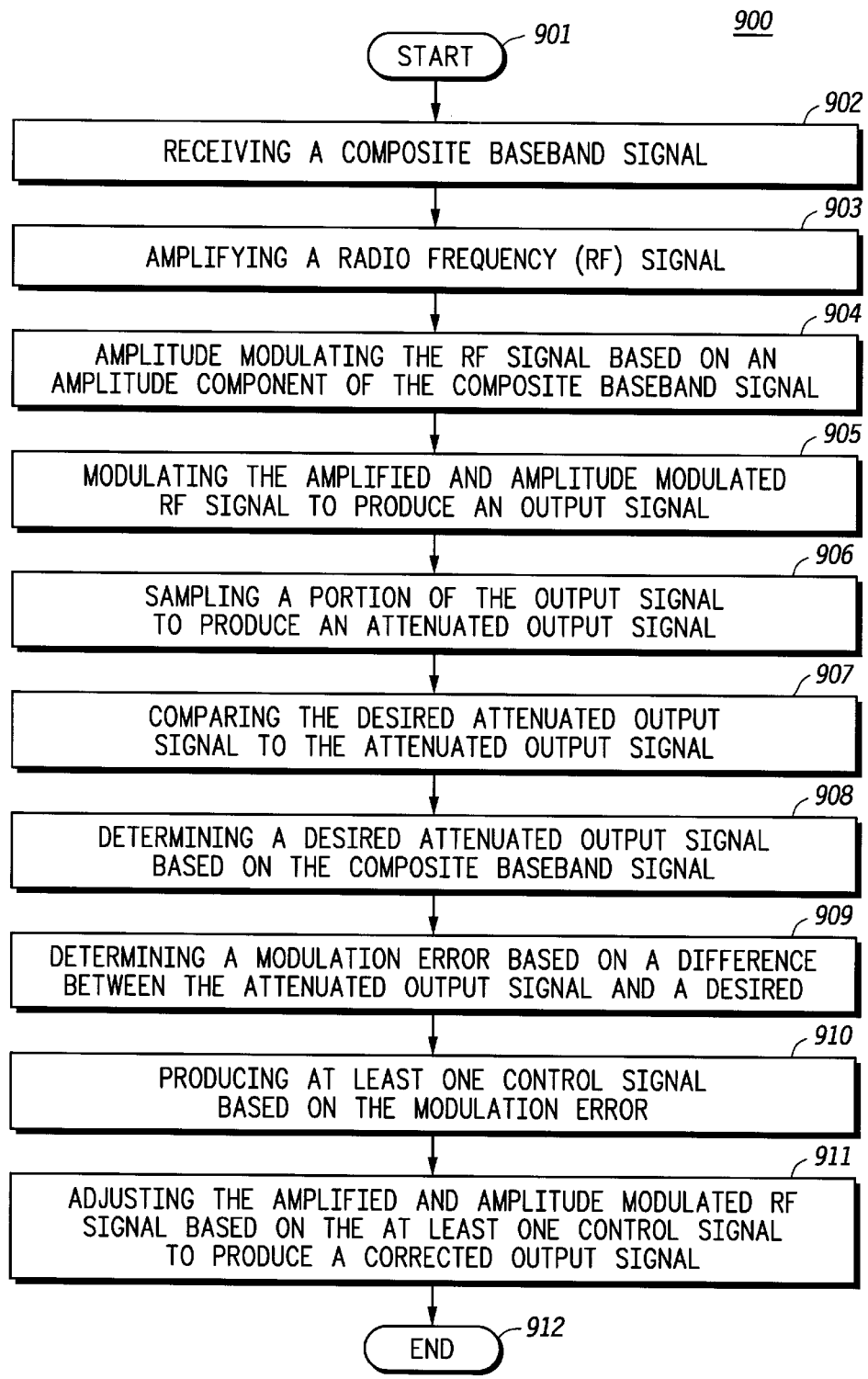
FIG. 9 is a logic flow diagram of steps executed by a communication device to amplify a radio frequency signal in accordance with the preferred embodiment of the present invention.

FIG. 9 is a logic flow diagram 900 of steps executed by a communication device to amplify an RF signal in accordance with a preferred embodiment of the present invention. The logic flow begins (901) when the communication device receives (902) a composite baseband signal. In the preferred embodiment, the composite baseband signal is an analog information signal output by a D/A, which analog information signal can be represented in a polar format by an amplitude component and a phase component or in a Cartesian format by an in-phase component and a quadrature component, or both, and which analog information signal is based on a digital information signal sourced by a DSP. The communication device amplifies (903), preferably by use of a power amplifier that comprises a class C biased RF amplifying element, the RF signal. Preferably, the RF signal is sourced to the power amplifier by a input phase modulator, preferably a phase adjustable frequency synthesizer such as a VCO synthesizer, that is coupled to the power amplifier.

The communication device amplitude modulates (904) the amplitude of the RF signal based on the amplitude component of the composite baseband signal. In the preferred embodiment, an amplitude component of the composite baseband signal is conveyed to a switching power supply. The switching power supply outputs a voltage and a current that serve as a direct current (DC) feed voltage and current for the power amplifier. A control circuit in the power supply modulates the amplitude of the voltage output by the power supply based on the amplitude component of the composite baseband signal. In turn, the power amplifier modulates the amplitude of the RF signal based on the amplitude modulation of the power amplifier DC feed voltage. The use of a switching power supply to modulate the amplitude of the RF signal permits the use of a class C biased RF amplifying element in the power amplifier, which class C bias results in an amplification and modulation scheme of high efficiency but inadequate linearity.

The communication device modulates (905) the amplified and amplitude modulated RF signal to produce an output signal. Preferably, the amplified and amplitude modulated phase modulated RF signal is modulated by an impedance modulator that is coupled to the output of the power amplifier. Since there are inherent nonlinearities in the power amplifier, the modulation of the output signal will be an incomplete replica of the composite baseband signal that was intended to replicated. The communication device samples (906) a portion of the output signal to produce an attenuated output signal. Preferably, the step of sampling includes the step of coupling, preferably by use of a signal coupler, a portion of the output signal to a feedback circuit. Preferably the feedback circuit is as is described above with respect to FIG. 5 and includes a quadrature downconverter, multiple amplifiers, a comparator, a limiter, and a quadrature modulator. Preferably, the quadrature downconverter includes multiple mixers coupled to a phase-shifting circuit and to a combiner, and a local oscillator coupled to one of the multiple mixers and to the phase-shifting circuit.

In the preferred embodiment, the communication device determines (907) a desired attenuated output signal based on the composite baseband signal. Preferably, the step of determining (907) a desired attenuated output signal includes the steps of receiving, preferably by the quadrature modulator, the composite baseband signal, modulating, by the quadrature modulator, the composite baseband signal to a frequency of the attenuated output signal to produce a desired attenuated output signal.

The communication device compares (908) the desired attenuated output signal and the attenuated output signal, and determines (909) a modulation error, preferably multiple modulation errors including an amplitude modulation error and a phase modulation error, based on a difference between the attenuated output signal and the desired attenuated output signal. In the preferred embodiment, the step of comparing (908) the desired attenuated output signal and the attenuated output signal includes the steps of conveying, by the quadrature modulator, the desired attenuated output signal to the comparator and to the limiter, conveying the attenuated output signal to the comparator, and comparing, by the comparator, the desired attenuated output signal to the attenuated output signal. Preferably the step of determining (909) a modulation error includes the step of determining, by the comparator, a modulation error based on a difference between the desired attenuated output signal and the attenuated output signal. Preferably, the modulation error comprises an error signal and the step of determining (909) a modulation error further includes the steps of amplifying the error signal and conveying the amplified error signal to the quadrature downconverter.

In the preferred embodiment, the communication device produces (910) at least one control signal based on the modulation error, preferably based on the amplified error signal. In the preferred embodiment, the step of producing (910) a control signal includes the steps of producing, by the limiter, a reference signal based on the desired attenuated output signal and conveying, by the limiter, the reference signal to the quadrature downconverter. The step of producing (910) a control signal preferably further includes the step of determining, by the quadrature downconverter, a control signal based on the reference signal and the amplified error signal, which control signal preferably includes an amplitude modulation error signal and the phase modulation error signal.

The step of determining an amplitude modulation error signal and a phase modulation error signal preferably includes the steps of splitting the amplified error signal into a first portion and a second portion, conveying the first portion of the amplified error signal to a first mixer of the multiple mixers, and multiplying the first portion of the amplified error signal with the reference signal to produce an amplitude modulation error signal. The step of determining an amplitude modulation error signal and a phase modulation error signal preferably further includes the steps of conveying the second portion of the amplified error signal to a second mixer of the multiple mixers, phase shifting the reference signal to produce a phase shifted reference signal, and multiplying the second portion of the amplified error signal with the phase shifted reference signal in the second mixer to produce a phase modulation error signal.

The communication device adjusts (911) the amplified and amplitude modulated phase modulated RF signal based on the at least one control signal to produce a corrected output signal, and the logic flow ends (912). Preferably, the step of adjusting (911) includes the steps of amplitude modulating the amplified and amplitude modulated phase modulated RF signal in response to the first control signal to reduce the amplitude modulation error and phase modulating the amplified and amplitude modulated phase modulated RF signal in response to the second control signal to reduce the phase modulation error. In the preferred embodiment, the first control signal comprises a voltage that is conveyed to the impedance modulator. A capacitance of the impedance modulator is adjusted in response to the voltage, resulting in a reduction of the amplitude modulation error. Also, in the preferred embodiment, the second control signal comprises a baseband signal that is conveyed to the input phase modulator, which input phase modulator modulates the phase of the radio frequency signal in response to the second control signal, resulting in a reduction of the phase modulation error. The adjustment of the output signal based on the modulation error provides a fine-tuning of the modulation of the RF signal. The fine-tuning compensates for the linearity inadequacies of an amplification and amplitude modulation scheme that uses a non-linear biased power amplifier and modulates the amplitude of the RF signal by modulating the power amplifier's DC feed voltage.

In an alternate embodiment of the present invention as described in FIG. 9, the feedback circuit further includes a feedback circuit input mixer coupled to the signal coupler and to the comparator, a feedback circuit input local oscillator coupled to the feedback circuit input mixer that generates a reference signal at an intermediate frequency (IF), a quadrature downconverter, multiple amplifiers, and a quadrature modulator, as is described above with respect to FIG. 7. Preferably, the quadrature downconverter includes multiple mixers coupled to a phase-shifting circuit and a quadrature downconverter local oscillator coupled to one of the multiple mixers and to the phase-shifting circuit, which local oscillator also produces a reference signal at the IF.

In the alternate embodiment, the step of determining (909) a modulation error includes the steps of receiving, preferably by the quadrature modulator, the composite baseband signal, modulating, by the quadrature modulator, the composite baseband signal to the IF to produce a desired IF attenuated output signal, and conveying, by the quadrature modulator, the desired IF attenuated output signal to the comparator and to the limiter. In the alternate embodiment, the step of determining (908) a modulation error further includes the steps of conveying the attenuated output signal to the feedback circuit input mixer, generating, by the feedback circuit input local oscillator, a reference signal at the IF to produce an IF reference signal, multiplying the attenuated output signal with the IF reference signal to produce an IF attenuated output signal, and conveying the IF attenuated output signal to the comparator. In the alternate embodiment, the step of determining (909) a modulation error further includes the steps of comparing, by the comparator, the desired IF attenuated output signal to the IF attenuated output signal, determining, by the comparator, an error signal based on a difference between the desired IF attenuated output signal and the IF attenuated output signal, amplifying the error signal, and conveying the amplified error signal to the quadrature downconverter. The communication device then produces (910) at least one control signal based on the modulation error, preferably based on the amplified error signal, as is described above in the preferred embodiment, except that the reference signal produced by the limiter is based on the desired IF attenuated output signal, which reference signal is conveyed by the limiter to the quadrature downconverter.

In another alternate embodiment of the present invention as described in FIG. 9, the step of producing (910) at least one control signal includes the steps of producing a control signal based on the amplitude modulation error and filtering the control signal to produce a filtered control signal. In addition, the step of adjusting (911) the amplified and amplitude modulated phase modulated radio frequency signal based on the at least one control signal to produce a corrected output signal includes modulating the amplified and amplitude modulated phase modulated radio frequency signal in response to the filtered control signal to reduce the amplitude modulation error.

In general, the present invention as described above provides a method for amplifying an RF signal that will provide high efficiency, good linearity and minimal adjacent channel coupled power. The RF signal is amplitude modulated, phase modulated, and amplified. The amplified and amplitude and phase modulated RF signal is sampled, and the sampled signal is compared to an upconverted baseband signal whose informational content has been modulated onto the amplitude and phase modulated RF signal. A modulation error is determined based on the comparison, and the amplified and amplitude and phase modulated signal is then adjusted based on the modulation error. By amplitude and phase modulating the RF signal, determining a modulation error, and then further modulating the modulated RF signal in order to fine tune the modulation and correct any error, the degree of linearity required in the initial modulation is reduced and the power amplifier can use a higher efficiency (and less linear) bias and modulation scheme than might otherwise be required.

Figure 10:
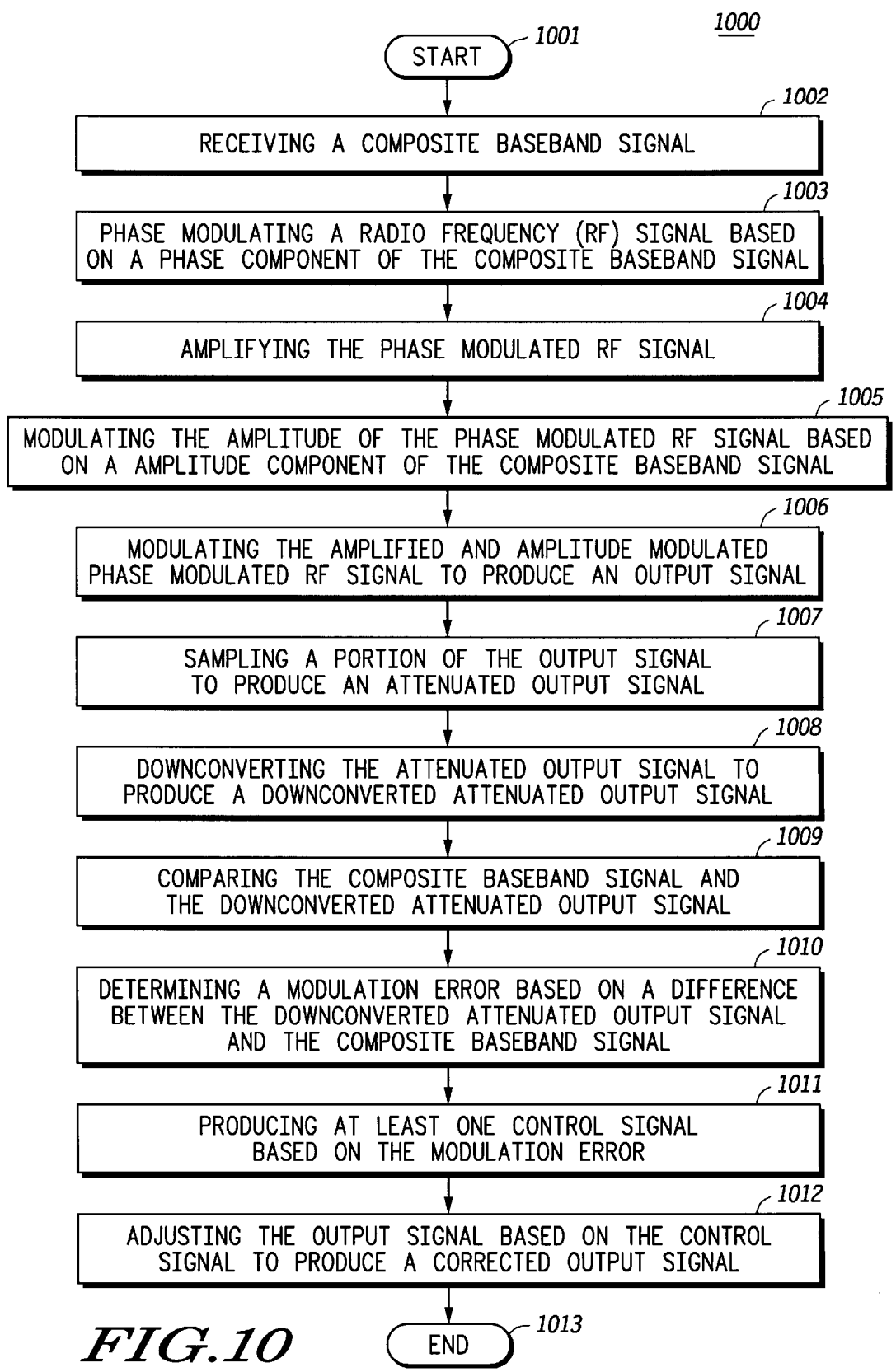
FIG. 10 is a logic flow diagram of steps executed by a communication device to amplify a radio frequency signal in accordance with an alternate embodiment of the present invention.

FIG. 10 is a logic flow diagram 1000 of steps executed by a communication device to amplify an RF signal in accordance with yet another alternate embodiment of the present invention. The logic flow begins (1001) when the communication device receives (1002) a composite baseband signal. As in the preferred embodiment, the composite baseband signal is an analog information signal output by a D/A, which analog information signal can be represented in a polar format or in a Cartesian format, or both, and which analog information signal is based on a digital information signal sourced by a DSP. The communication device phase modulates (1003), preferably by use of an input phase modulator, preferably a VCO synthesizer, the RF signal based on the phase component of the composite baseband signal to produce a phase modulated RF signal. The communication device amplifies (1004) the phase modulated RF signal and modulates (1005) the amplitude of the phase modulated RF signal based on the amplitude component of the composite baseband signal. The communication device modulates (1006) the amplified and amplitude modulated phase modulated RF signal to produce an output signal, and samples (1007) a portion of the output signal to produce an attenuated output signal. In the alternate embodiment as described in FIG. 10, the step of sampling preferably includes the step of coupling, preferably by use of a signal coupler, a portion of the output signal to a feedback circuit that preferably includes a quadrature downconverter, multiple amplifiers, a comparator, and a phase modulator, preferably a frequency synthesizer, as is described above with respect to FIG. 6. Preferably, the quadrature downconverter includes multiple mixers coupled to a phase-shifting circuit and a local oscillator coupled to one of the multiple mixers and to the phase-shifting circuit.

In the alternate embodiment as described in FIG. 10, the communication device downconverts (1008), preferably to baseband frequency, the attenuated output signal to produce a downconverted attenuated output signal. Preferably, the step of downconverting (1008) includes the steps of receiving, by a feedback phase modulator, preferably a phase adjustable frequency synthesizer, a phase component of the composite baseband signal, generating, preferably by the feedback phase modulator, a reference signal that is phase modulated by the feedback phase modulator based on the received phase component, and conveying, by the feedback phase modulator, the reference signal to the quadrature downconverter. Preferably, the frequency of the reference signal is the output signal frequency.

Preferably, the step of downconverting (1008) further includes the steps of conveying the attenuated output signal by the signal coupler to the quadrature downconverter, splitting, by the quadrature downconverter, the attenuated output signal into a first portion and a second portion, conveying the first portion of the attenuated output signal to a first mixer of the multiple mixers, and conveying the second portion of the attenuated output signal to a second mixer of the multiple mixers. Preferably, the step of downconverting (1008) further includes the steps of multiplying, by the first mixer, the first portion of the attenuated output signal with the reference signal to produce an amplitude modulated downconverted, preferably to baseband, version of the attenuated output signal, phase shifting the reference signal to produce a phase shifted reference signal, and multiplying, by the second mixer, the second portion of the attenuated output signal with the phase shifted reference signal to produce a phase modulated downconverted, preferably to baseband, version of the attenuated output signal. In the alternate embodiment as described in FIG. 10, the phase modulated downconverted version of the attenuated output signal includes a phase modulation error signal.

The communication device compares (1009) the composite baseband signal and the downconverted attenuated output signal. Preferably the step of comparing (1009) includes the steps of conveying, by the quadrature downconverter to the comparator, the amplitude modulated baseband version of the attenuated output signal, receiving, by the comparator from a D/A, an analog amplitude component of the composite baseband signal, and comparing, by the comparator, the amplitude modulated baseband version of the attenuated output signal and the analog amplitude component of the composite baseband signal.

The communication device determines (1010) a modulation error based on a difference between the composite baseband signal and the downconverted attenuated output signal. Preferably the step of determining (1010) a modulation error includes the steps of determining, by the comparator, an amplitude modulation error signal based on a difference between the composite baseband signal and the downconverted attenuated output signal and determining a phase modulation error signal based on the phase modulated downconverted version of the attenuated output signal.

The communication device produces (1011) at least one control signal based on the modulation error. Preferably, the at least one control signal includes a first control signal, preferably the amplitude modulation error signal, and a second control signal, preferably the phase modulation error signal. The communication device adjusts (1012) the amplified and amplitude modulated phase modulated RF signal based on the at least one control signal to produce a corrected output signal, and the logic flow ends (1013). Similar to the step of adjusting (911) described above with respect to FIG. 9, the step of adjusting (1012) described in FIG. 10 comprises the steps of amplitude modulating the amplified and amplitude modulated phase modulated RF signal in response to the first control signal to reduce amplitude modulation error and phase modulating the amplified and amplitude modulated RF signal in response to the second control signal to reduce phase modulation error.

In general, in the alternate embodiment as described in FIG. 10, the signal processing involved in the determination of a modulation error occurs at a baseband frequency or at an intermediate frequency, as opposed to the preferred embodiment where the signal processing occurs at the frequency of the output signal.

In sum, the present invention provides a method and apparatus for the linear amplification of RF signal 411 by modulating a supply voltage of a power amplifier 410 and then using a feedback circuit 416 to reduce any resulting errors. By amplitude modulating the RF signal 411 via the supply voltage of a power amplifier 410, an amplifying element of the power amplifier 410 may be biased class C as opposed to class A or class AB, resulting in a higher efficiency design. However, this also results in an incomplete replica of the desired signal (i.e., the information signal generated by DSP 401) due to the limited bandwidth of the supply voltage modulation. To reduce the resulting errors, the present invention further provides a polar feedback circuit 416 that generates multiple polar error signals 420, 422. In response to the polar error signals 420, 422, impedance modulator 412 reduces an amplitude error and input phase modulator 424 reduces a phase error. By inclusion of impedance modulator 412, errors due to bandwidth limitations of switching power supply 426, which switching power supply 426 produces the supply voltage, may be overcome.

Furthermore, by determining a single error signal that is subsequently resolved by quadrature downconverter 510 into separately polar error signals, and by including limiter 520 and quadrature downconverter 510 in the forward path of an overall linear amplifier loop, the effect of delay mismatches in the separate feedback paths and the non-linear effects of AM/PM conversion of the prior art are minimized. In addition, by amplifying the error signals before, rather than after, downconverter mixers 514, 516, any detrimental impact of any DC offsets used to realize the mixers 514, 516 is reduced.

While the present invention has been particularly shown and described with reference to particular embodiments thereof, it will be understood by those skilled in the art that various changes in form and details may be made therein without departing from the spirit and scope of the present invention.

We claim:

1. An apparatus for the linear amplification of a radio frequency signal, the apparatus comprising:
   a modulating amplifier that is effective to modulate, in response to at least one control signal, and to amplify a radio frequency input signal to produce an output signal, wherein the modulating amplifier comprises:
   at least one input port coupled to receive the radio frequency input signal;
   an amplifier that amplifies the radio frequency input signal;
   an impedance modulator that modulates the radio frequency input signal in response to the at least one control signal;
   an output port;
   a signal coupler, coupled to the modulating amplifier, that is effective to sample a portion of the output signal to produce an attenuated output signal; and
   a feedback circuit, coupled to the signal coupler and the modulating amplifier, that is effective to determine a modulation error between a baseband input signal and the attenuated output signal and is effective to generate the at least one control signal to reduce the modulation error.

2. The apparatus of claim 1, wherein the at least one input port of the amplifier includes a supply port, wherein the linear transmitter further comprises a switching power supply coupled to the supply port of the amplifier, wherein the switching power supply is capable of generating a modulated supply voltage, and wherein the modulated supply voltage corresponds to an amplitude variation of the baseband input signal.

3. The apparatus of claim 1, further comprising a phase modulator coupled to the at least one input port of the amplifier, wherein the phase modulator is capable of generating the radio frequency input signal and phase modulating the radio frequency input signal to produce a phase modulated input signal, and wherein the phase modulated input signal corresponds to a phase variation of the baseband input signal.

4. The apparatus of claim 3, wherein the phase modulator is further coupled to the feedback circuit, wherein the modulation error comprises at least a phase modulation error, and wherein the phase modulator is effective to adjust a phase of the radio frequency input signal based on the at least one control signal to reduce the modulation error.

5. The apparatus of claim 1, wherein the feedback circuit comprises:
   a feedback phase modulator that is effective to produce a phase modulated reference signal corresponding to a phase variation of the baseband input signal;
   a first mixer, coupled to the signal coupler and the phase modulator, that is effective to produce a downconverted signal;
   a comparator, coupled to the first mixer, that is effective to produce a first control signal of the at least one control signal representing an amplitude modulation error based on a difference between the downconverted signal and the baseband input signal;
   a phase-shifting circuit, coupled to the feedback phase modulator, that is effective to introduce an approximately ninety degree phase offset to the phase modulated reference signal; and
   a second mixer, coupled to the phase-shifting circuit and the signal coupler, that is effective to produce a second control signal of the at least one control signal representing a phase modulation error.

6. The apparatus of claim 5, wherein the first control signal comprises a high frequency component, a low frequency component, or both a high frequency component and a low frequency component, and wherein the feedback circuit further comprises:
   a low pass filter coupled to the subtractor and to the switching power supply, wherein the low pass filter is effective to receive at least a portion of the first control signal, filter out the high frequency component, and convey the low frequency component to the switching power supply; and
   a high pass filter coupled to the subtractor and to the impedance modulator, wherein the high pass filter is effective to receive at least a portion of the first control signal, filter out the low frequency component, and convey the high frequency component to the impedance modulator.

7. The apparatus of claim 5, further comprising an input phase modulator coupled to the input port of the amplifier and the feedback circuit, wherein the input phase modulator is capable of generating a radio frequency input signal and phase modulating the radio frequency input signal to produce a phase modulated input signal, wherein the impedance modulator is responsive to the first control signal to reduce the amplitude modulation error, and wherein the input phase modulator is responsive to the second control signal to reduce the phase modulation error.

8. The apparatus of claim 1, wherein the baseband input signal comprises a quadrature modulation information signal, and wherein the feedback circuit comprises:
   a quadrature modulator that is effective to upconvert the quadrature modulation information signal to a frequency of the output signal to produce a quadrature modulated reference signal;
   an amplitude suppressor, coupled to the quadrature modulator, that is effective to produce a phase modulated reference signal at the frequency of the output signal;
   a comparator, coupled to the quadrature modulator and the signal coupler, that is effective to produce an error signal at approximately the frequency of the output signal based on a difference between the attenuated output signal and the quadrature modulated reference signal;
   a first mixer, coupled to the comparator and the amplitude suppressor, that is effective to produce a first control signal of the at least one control signal representing an amplitude modulation error;
   a phase-shifting circuit, coupled to the amplitude suppressor, that is effective to introduce an approximately ninety degree phase offset to the phase modulated reference signal; and
   a second mixer, coupled to the phase-shifting circuit and the subtractor, that is effective to produce a second control signal of the at least one control signal representing a phase modulation error.

9. The apparatus of claim 8, further comprising a phase modulator coupled to the input port of the amplifier and the feedback circuit, wherein the phase modulator is capable of generating a radio frequency input signal and phase modulating the radio frequency input signal to produce a phase modulated input signal, wherein the impedance modulator is responsive to the first control signal to reduce the amplitude modulation error, and wherein the phase modulator is responsive to the second control signal to reduce the phase modulation error.

10. The apparatus of claim 9, further comprising:
    a third mixer, coupled to the signal coupler and to the comparator;
    a local oscillator circuit, coupled to the third mixer; and
    wherein the third mixer is effective to downconvert the attenuated output signal to an intermediate frequency to produce an intermediate frequency attenuated output signal, the quadrature modulator is effective to upconvert the quadrature modulated signal to the intermediate frequency to produce a quadrature modulated reference signal, and the comparator is effective to produce an error signal at approximately the intermediate frequency based on a difference between the intermediate frequency attenuated output signal and the quadrature modulated reference signal.

11. An apparatus for the linear amplification of a radio frequency signal, the apparatus comprising:
    an amplifier having at least one input port coupled to receive a modulated input signal and an output port that is effective to produce an output signal based on the modulated input signal;
    a first modulator, coupled to the at least one input port of the amplifier, that is effective to generate a modulated input signal responsive to at least one control signal;
    a signal coupler, coupled to the output port of the amplifier, that is effective to sample a portion of the output signal to produce an attenuated output signal;
    a polar feedback circuit, coupled to the signal coupler and at least the first modulator, that is effective to receive a baseband input signal, to determine a modulation error between the baseband input signal and the attenuated output signal, and to generate the at least one control signal to reduce the modulation error, wherein the polar feedback circuit comprises:
      a second modulator that is effective to produce a phase modulated reference signal corresponding to a phase variation of the baseband input signal;
      a phase-shifting circuit, coupled to the second modulator, that is effective to introduce an approximately ninety degree phase offset to the phase modulated reference signal to produce a phase-shifted reference signal; and a first mixer, coupled to the phase-shifting circuit, the signal coupler, and the first modulator, that is effective to produce at least one control signal representing a phase modulation error based on a difference between the attenuated output signal and the phase-shifted reference signal.

12. The apparatus of claim 11, wherein the first modulator comprises a phase modulator, coupled to the at least one input port of the amplifier, capable of generating a radio frequency input signal and phase modulating the radio frequency input signal to produce a phase modulated input signal.

13. The apparatus of claim 11, wherein the first modulator comprises an amplitude modulator, coupled to the at least one input port of the amplifier, capable of generating an amplitude modulated input signal.

14. The apparatus of claim 13, wherein the amplitude modulator comprises a switching power supply.

15. The apparatus of claim 13, wherein the polar feedback circuit further comprises:

a second mixer, coupled to the second modulator, that receives the attenuated output signal and is effective to produce a downconverted signal;

a subtractor, coupled to the second mixer, that is effective to produce a first control signal of the at least one control signal representing an amplitude modulation error based on a difference between the downconverted signal and the baseband input signal; and wherein the first mixer produces a second control signal of the at least one control signal representing an phase modulation error based on the attenuated output signal and the phase-shifted reference signal.

16. The apparatus of claim 15, further comprising:

a third mixer, coupled to the signal coupler, the first mixer, and the second mixer;

a local oscillator circuit, coupled to the third mixer; and wherein the third mixer is effective to downconvert the attenuated output signal to an intermediate frequency to produce an intermediate frequency attenuated output signal, and wherein at least a portion of the intermediate frequency attenuated output signal is conveyed to each of the first mixer and the second mixer.

17. The apparatus of claim 16, wherein the amplitude modulator is coupled to the feedback path and is responsive to the first control signal to reduce the amplitude modulation error and wherein the first modulator is responsive to the second control signal to reduce the phase modulation error.

18. The apparatus of claim 11, wherein the baseband input signal comprises a quadrature modulation information signal, wherein the second modulator is effective to modulate the quadrature modulation information signal to a frequency of the output signal to produce a quadrature modulated reference signal, wherein the phase-shifting circuit is effective to introduce an approximately ninety degree phase offset to the quadrature modulated reference signal to produce a phase-shifted reference signal, wherein the first mixer is effective to produce at least one control signal representing a phase modulation error based on an error signal and the phase-shifted reference signal, and wherein the polar feed back circuit further comprises a comparator, coupled to the second modulator, that receives the attenuated output signal and is effective to produce the error signal at approximately the frequency of the output signal based on a difference between the attenuated output signal and the quadrature modulated reference signal.

19. The apparatus of claim 18, wherein the first modulator comprises a phase modulator, coupled to the at least one input port of the amplifier, capable of generating a radio frequency input signal and phase modulating the radio frequency input signal to produce a phase modulated input signal.

20. The apparatus of claim 19, wherein the linear transmitter further comprises a third modulator, coupled to the at least one input port of the amplifier, capable of generating an amplitude modulated input signal.

21. The apparatus of claim 20, wherein the third modulator comprises a switching power supply.

22. The apparatus of claim 20, wherein the polar feedback circuit further comprises:

a second mixer, coupled to the comparator, the second modulator, and the third modulator, that is effective to produce a first control signal of the at least one control signal representing an amplitude modulation error; and wherein the first mixer is effective to produce a second control signal of the at least one control signal representing a phase modulation error.

23. The apparatus of claim 22, wherein the third modulator is responsive to the first control signal to reduce the amplitude modulation error and wherein the first modulator is responsive to the second control signal to reduce the phase modulation error.

24. The apparatus of claim 22, further comprising a scalar modulator, coupled to the output port of the amplifier, to the signal coupler, and to the polar feedback circuit, wherein the scalar modulator is responsive to the first control signal to reduce the amplitude modulation error and wherein the first modulator is responsive to the second control signal to reduce the phase modulation error.

25. The apparatus of claim 24, wherein the first control signal comprises a high frequency component, a low frequency component, or both a high frequency component and a low frequency component, and wherein the polar feedback circuit further comprises:

a low pass filter coupled to the second mixer and to the third modulator, wherein the low pass filter is effective to receive at least a portion of the first control signal, filter out the high frequency component, and convey the low frequency component to the third modulator; and a high pass filter coupled to the second mixer and to the scalar modulator, wherein the high pass filter is effective to receive at least a portion of the first control signal, filter out the low frequency component, and convey the high frequency component to the scalar modulator.

26. The apparatus of claim 22, wherein the polar feedback circuit further comprises an amplitude suppressor, coupled between the second modulator, the phase-shifting circuit, and the second mixer, that is effective to produce a phase modulated reference signal at approximately the frequency of the output signal, and wherein the phase-shifting circuit introduces an approximately ninety degree phase offset to the carrier reference signal to produce a phase-shifted reference signal.

27. The apparatus of claim 26, further comprising:

a third mixer, coupled to the signal coupler and to the subtractor;

a local oscillator circuit, coupled to the third mixer; and wherein the third mixer is effective to downconvert the attenuated output signal to an intermediate frequency to produce an intermediate frequency attenuated output signal, the second modulator is effective to upconvert the quadrature modulated signal to the intermediate frequency to produce a quadrature modulated reference signal, and the subtractor is effective to produce an error signal at approximately the intermediate frequency based on a difference between the intermediate frequency attenuated output signal and the quadrature modulated reference signal.

28. A method for amplifying a radio frequency signal comprising the steps of:

receiving a composite baseband signal, wherein the phase modulated baseband signal comprises an amplitude component;

amplifying the radio frequency signal;

amplitude modulating the radio frequency signal based on the amplitude component of the composite baseband signal;

modulating the amplified and amplitude modulated radio frequency signal to produce an output signal;

sampling a portion of the output signal to produce an attenuated output signal;

determining a desired attenuated output signal based on the composite baseband signal;

comparing the desired attenuated output signal to the attenuated output signal;

determining a modulation error based on a difference between the attenuated output signal and the desired attenuated output signal;

producing at least one control signal based on the modulation error; and adjusting the amplified and amplitude modulated radio frequency signal based on the at least one control signal to produce a corrected output signal.

29. The method of claim 28, wherein the step of determining a desired attenuated output signal based on the composite baseband signal comprises the step of modulating the composite baseband signal to a frequency of the attenuated output signal to produce a desired attenuated output signal.

30. The method of claim 28, wherein the modulation error comprises an error signal and wherein the step of producing at least one control signal based on the modulation error comprises the following steps:

producing a reference signal based on the desired attenuated output signal; and determining at least one control signal based on the reference signal and the error signal.

31. The method of claim 30, wherein the at least one control signal comprises a first control signal, comprising an amplitude modulation error signal, and a second control signal, comprising a phase modulation error signal, and wherein the step of determining at least one control signal based on the reference signal and the error signal comprises the following steps:

splitting the error signal into a first portion and a second portion;

multiplying the first portion of the error signal with the reference signal to produce an amplitude modulation error signal;

phase shifting the reference signal to produce a phase shifted reference signal; and multiplying the second portion of the amplified error signal with the phase shifted reference signal to produce a phase modulation error signal.

32. The method of claim 28, wherein the at least one control signal comprises an amplitude modulation error signal and wherein the step of adjusting the amplified and amplitude modulated radio frequency signal based on the at least one control comprises the step of amplitude modulating the amplified and amplitude modulated phase modulated RF signal in response to the amplitude modulation error signal to reduce the amplitude modulation error.

33. The method of claim 28, wherein the at least one control signal comprises a phase modulation error signal and wherein the step of adjusting the amplified and amplitude modulated radio frequency signal based on the at least one control signal comprises the step of phase modulating the amplified and amplitude modulated phase modulated RF signal in response to the phase modulation error signal to reduce the phase modulation error.

34. The method of claim 28, wherein the step of determining a modulation error comprises the steps of:

modulating the composite baseband signal to an intermediate frequency (IF) to produce a desired IF attenuated output signal;

generating a reference signal at the IF to produce an IF reference signal;

multiplying the attenuated output signal with the IF reference signal to produce an IF attenuated output signal;

comparing the desired IF attenuated output signal to the IF attenuated output signal;

determining a modulation error based on a difference between the desired IF attenuated output signal and the IF attenuated output signal, wherein the modulation error comprises an error signal.

35. The method of claim 28, wherein the modulation error comprises an amplitude modulation error and wherein the step producing at least one control signal based on the modulation error comprises the steps of:

producing a control signal based on the amplitude modulation error;

filtering the control signal to produce a filtered control signal; and wherein the step of adjusting the amplified and amplitude modulated radio frequency signal based on the at least one control signal to produce a corrected output signal comprises amplitude modulating the amplified and amplitude modulated radio frequency signal in response to the filtered control signal to reduce the amplitude modulation error.

36. A method for amplifying a radio frequency signal comprising the steps of:

receiving a composite baseband signal, wherein the composite baseband signal comprises a phase component and an amplitude component;

phase modulating the radio frequency (RF) signal based on the phase component of the composite baseband signal to produce a phase modulated RF signal;

amplifying the phase modulated RF signal;

modulating the amplitude of the phase modulated RF signal based on the amplitude component of the composite baseband signal;

modulating the amplified and amplitude modulated phase modulated RF signal to produce an output signal;

sampling a portion of the output signal to produce an attenuated output signal;

downconverting the attenuated output signal to produce a downconverted attenuated output signal;

comparing the composite baseband signal and the downconverted attenuated output signal;

determining a modulation error based on a difference between the downconverted attenuated output signal and the composite baseband signal;

producing at least one control signal based on the modulation error; and adjusting the amplified and amplitude modulated phase modulated RF signal based on the at least one control signal to produce a corrected output signal.

37. The method of claim 36, wherein the modulation error comprises an amplitude modulation error.

38. The method of claim 37, wherein the step of adjusting the amplified and amplitude modulated phase modulated radio frequency signal comprises modulating the amplified and amplitude modulated phase modulated radio frequency signal in response to the at least one control signal to reduce the amplitude modulation error.

39. The method of claim 36, wherein the step of downconverting comprises the steps of:

generating a reference signal that is based on the phase component of the composite baseband signal; and multiplying the reference signal and at least a portion of the attenuated output signal to produce a downconverted attenuated output signal.

40. The method of claim 36, wherein the step of downconverting comprises the steps of:

generating a reference signal that is based on the phase component of the composite baseband signal;

splitting the attenuated output signal into a first portion and a second portion;

multiplying the reference signal and the first portion of the attenuated output signal to produce an amplitude modulated downconverted version of the attenuated output signal;

phase shifting the reference signal to produce a phase shifted reference signal;

multiplying the phase shifted reference signal and the second portion of the attenuated output signal to produce a phase modulated downconverted version of the attenuated output signal.

41. The method of claim 40, wherein the step of determining a modulation error comprises the steps of:

determining an amplitude modulation error based on a difference between the downconverted attenuated output signal and the composite baseband signal; and determining a phase modulation error based on the phase modulated downconverted version of the attenuated output signal.

42. The method of claim 41, wherein the step of producing at least one control signal comprises producing a first control signal based on the amplitude modulation error and a second control signal based on the phase modulation error.

43. The method of claim 42, wherein the step of adjusting the amplified and amplitude modulated phase modulated radio frequency signal comprises modulating the amplified and amplitude modulated phase modulated radio frequency signal in response to the second control signal to reduce the phase modulation error.

44. A communication device comprising:

a receiver;

a linear transmitter comprising:
    an amplifier having at least one input port coupled to receive a modulated input signal and an output port that produces an amplified modulated signal;
    a complex modulator, coupled to the output port of the amplifier, that further modulates the amplified modulated signal responsive to at least one control signal to produce an output signal;
    a signal coupler, coupled to the complex modulator, that samples a portion of the output signal to produce an attenuated output signal; and
    a feedback circuit, coupled to the signal coupler and at least the complex modulator, that receives a quadrature modulation information signal from an information source, receives the attenuated output signal from the signal coupler, determines a modulation error based on quadrature modulation information signal and the attenuated output signal, and generates the at least one control signal to reduce the modulation error.

\* \* \* \* \*